United States Patent [19]
Moslehi

[11] Patent Number: 5,936,829
[45] Date of Patent: Aug. 10, 1999

[54] THERMALLY CONDUCTIVE CHUCK FOR VACUUM PROCESSOR

[75] Inventor: Mehrdad M. Moslehi, Los Altos, Calif.

[73] Assignee: CVC Products, Inc., Rochester, N.Y.

[21] Appl. No.: 08/934,287

[22] Filed: Sep. 19, 1997

Related U.S. Application Data

[60] Provisional application No. 60/035,734, Jan. 2, 1997.
[51] Int. Cl.$^6$ .................................................. H02N 13/00
[52] U.S. Cl. .......................................... 361/234; 279/128
[58] Field of Search ..................... 279/128; 361/230–235

[56] References Cited

U.S. PATENT DOCUMENTS

| | | | |
|---|---|---|---|
| 4,603,466 | 8/1986 | Morley .................................... | 29/569 R |
| 4,615,755 | 10/1986 | Tracy et al. ............................. | 156/345 |
| 4,680,061 | 7/1987 | Lamont, Jr. . | |
| 4,743,570 | 5/1988 | Lamont, Jr. . | |
| 4,909,314 | 3/1990 | Lamont, Jr. . | |
| 4,949,783 | 8/1990 | Lakios et al. . | |
| 4,971,653 | 11/1990 | Powell et al. . | |
| 5,103,367 | 4/1992 | Horwitz et al. .......................... | 361/234 |
| 5,177,878 | 1/1993 | Visser . | |
| 5,192,849 | 3/1993 | Moslehi . | |
| 5,244,820 | 9/1993 | Kamata et al. ........................... | 437/20 |
| 5,267,607 | 12/1993 | Wada ....................................... | 165/80.1 |
| 5,320,982 | 6/1994 | Tsubone et al. . | |
| 5,452,177 | 9/1995 | Frutiger .................................. | 361/234 |
| 5,474,614 | 12/1995 | Robbins ................................... | 361/234 |
| 5,547,539 | 8/1996 | Arasawa et al. ..................... | 156/626.1 |
| 5,567,267 | 10/1996 | Kazama et al. . | |
| 5,622,593 | 4/1997 | Arasawa et al. ..................... | 156/626.1 |
| 5,636,098 | 6/1997 | Salfelder et al. ........................ | 361/234 |
| 5,720,818 | 2/1998 | Donde et al. ............................ | 118/500 |
| 5,740,009 | 4/1998 | Pu et al. .................................. | 361/234 |
| 5,748,435 | 5/1998 | Parkhe .................................... | 361/234 |
| 5,805,408 | 9/1998 | Maraschin et al. ..................... | 361/234 |

FOREIGN PATENT DOCUMENTS 1251735  10/1989  Japan .

*Primary Examiner*—Fritz Fleming
*Attorney, Agent, or Firm*—Eugene Stephens & Associates

[57] ABSTRACT

A chuck body mounts a substrate within a vacuum chamber. Contiguous portions of the substrate and the chuck body form a heat-transfer interface. An intermediate sealing structure seals the chuck body to the substrate independently of any contact between the chuck body and the substrate and forms a separately pressurizable region within the vacuum chamber. A control system promotes flows of gas through a periphery of the heat-transfer interface within the separately pressurizable region for controlling gas pressures at the heat-transfer interface.

27 Claims, 19 Drawing Sheets ered to as a "backside" gas, within a space that includes the interface between the chuck body and the substrate but also extends beyond the interface to permit free exchanges and flows of gas through at least a portion of the interface periphery. Conduits can be connected to the interface and the space beyond the interface to promote uninhibited flows of

THERMALLY CONDUCTIVE CHUCK FOR VACUUM PROCESSOR

This application claims the benefit of U.S. Provisional application Ser. No. 60/035,734, filed on Jan. 2, 1997, which provisional application is incorporated by reference herein.

TECHNICAL FIELD

The invention relates to the active heating or cooling of substrates in vacuum processing environments using thermally conductive chucks for transferring heat to or from the substrates. The chucks can be used in various vacuum processing systems such as those employing physical-vapor deposition (PVD) and chemical-vapor deposition (CVD).

BACKGROUND

Vacuum processing operations take place in vacuum chambers that include chucks for supporting substrates within the chambers. Some such chucks merely provide a substrate support platform and rely on gravity to hold the substrates in place. Others actively secure the substrates with either mechanical or electrostatic clamps.

Some chucks are also involved with the processing of the substrates by producing electrical or magnetic fields or by regulating heat transfers to or from the substrates. In plasma-assisted processes, electrical fields (e.g., chuck RF bias) direct or distribute plasma and related plasma ions impinging on the substrate. In data-storage device applications, magnetic fields can be used to magnetically orient films during their deposition onto substrates or during their subsequent thermal annealing. Heat transfers are used to remove excess heat produced by such processing operations or to provide a controlled amount of heating to assist the processing of the substrates. For example, some operations are best performed at constant substrate temperatures or at substrate temperatures that are adjusted throughout different stages of the operations.

During operations like thermal depositions (e.g., CVD) and annealing, elevated temperatures actually accomplish the substrate processing. For instance, heat-generating chucks for controlling substrate temperatures (e.g., up to 450° C.) are required for PVD reflow depositions of Al or Cu interconnect materials. Metal-organic chemical-vapor deposition (MOCVD) processes for depositing semiconductor interconnect materials (e.g., Al or Cu) or barrier materials (e.g., TiN or TaN) also require heat-generating chucks for controlling substrate temperatures (e.g., up to 350° C.).

However, controlling substrate temperatures in near vacuum or other low-pressure environments is quite difficult because heat does not transfer well in a vacuum. For example, the conduction of heat between contiguous surfaces of a chuck body and the substrate is very slow and inefficient because actual contact on an atomic scale between the surfaces is limited to a small fraction of their common area, and gaps that separate the remaining areas of their surfaces are sufficient to prevent effective heat transfer by conduction.

Heating and cooling of substrates through radiational heat transfers are possible in a vacuum environment, particularly at elevated substrate and chuck temperatures, but radiational heat transfers are generally too slow to maintain substrates at desired processing temperatures. This is particularly true for most chuck-based fabrication processes with substrate temperatures below 450° C. Faster transfers are possible by pumping a gas, preferably an inert gas such as helium or argon or an other gas such as nitrogen, between the chuck body and the substrate. Although still at much less than atmospheric pressure, the gas sufficiently fills the small gaps between the chuck body and the substrate to support significant heat transfer through thermal conduction between them. A seal formed between the mounting surface of the chuck body and the substrate resists significant leakage of the gas into the rest of processing chamber.

U.S. Pat. No. 4,680,061 to Lamont, Jr. discloses chucks having heating or cooling elements for regulating substrate temperatures. One of the chucks has a ceramic heating element mounted in a cavity between a chuck body and a substrate. The heating element is mounted close to a back side of the substrate but not in contact. Argon gas is introduced into the cavity to promote heat exchanges between the heating element and the substrate. A raised rim of the chuck body on which the substrate is mounted contacts a peripheral portion of the substrate's back side forming a seal that inhibits leakage of the gas out of the cavity.

Another of Lamont, Jr.'s chucks has a chuck body that functions as a heat sink with coolant channels for conveying heat from the sink. A similar cavity is formed by a raised rim in the chuck body so that the remaining heat sink is positioned close but not in contact with the back side of a substrate. Argon gas is similarly trapped within the cavity by contact between the raised rim of the chuck and the back side of the substrate.

U.S. Pat. No. 4,949,783 to Lakios et al. also discloses a chuck using gas pressure against a back side of a substrate to promote substrate cooling. A similar cavity is formed in the chuck body and surrounded by a raised rim for contacting the back side of the substrate. However, instead of merely pumping gas into the cavity, Lakios et al. circulate the gas both into and out of the cavity by establishing a gas flow. Part of the heat transfer from the substrate is due to gas-conducted heat exchanges with the chuck body, and another part of the heat transfer is due to the removal of heated gas from the cavity.

The chucks of both Lamont, Jr. and Lakios et al. include raised rims on their chuck bodies that function as both mounting surfaces and seals. Mechanical clamps press the substrates against the raised rims of their chuck bodies to tighten the seals and to reduce leakage of back side gas into their processing chambers. Lakios et al. also use an O-ring seal next to their raised rim to provide an even tighter seal for further reducing leakage.

SUMMARY OF INVENTION

This invention in one or more of its embodiments improves substrate chucks that use gas as a medium for transferring heat to or from substrates in a vacuum processor by at least partially separating the function of mounting a substrate on a chuck body from the function of sealing a contiguous space between them. The substrate can be mounted directly against a top surface of the chuck body, which is either heated or cooled, for providing a large heat-transfer interface, and a separate sealing structure can be used to seal the chuck body to the substrate beyond the interface between the chuck body and the substrate.

The sealing structure confines the gas, which is referred to as a "backside" gas, within a space that includes the interface between the chuck body and the substrate but also extends beyond the interface to permit free exchanges and flows of gas through at least a portion of the interface periphery. Conduits can be connected to the interface and the space beyond the interface to promote uninhibited flows of the backside gas to or from the interface. Channels formed in the expanse of the chuck body contiguous to the substrate can be used to ensure uninhibited gas flows within the interface.

Thus, instead of inhibiting flows through a sealed periphery of a heat-transfer interface as practiced in the prior art, a free flow of the backside gas through the interface is permitted and preferably promoted. This invention in one or more of its embodiments also replaces a seal on which the substrate is mounted above a chuck body with a sealing structure separate from a mounting surface of the chuck body so the functions of substrate mounting and sealing can be separately optimized for the benefit of each function as well as for enhancing transfers of heat between the chuck body and the substrate. In addition, this invention can be used to minimize the amount of backside gas leakage into the vacuum chamber, while allowing uninhibited backside gas flow through the substrate/chuck periphery.

An embodiment of the new thermally conductive chuck includes a temperature regulator, such as a heater or cooler, in thermal communication with a chuck body. A mounting surface of the chuck body supports a substrate (e.g., a semiconductor wafer or a data storage thin-film head substrate) within an evacuated space of a processing chamber and forms together with the substrate a heat-transfer interface between them. An intermediate sealing structure seals the chuck body to the substrate beyond the heat-transfer interface for confining gas within an isolated portion of the evacuated space that permits free exchanges of the gas through a periphery of the interface.

The isolated portion of the evacuated space is a separately pressurizable region of the processing chamber and may have a gas pressure different from (e.g., higher than) the gas pressure in the remaining regions of the processing chamber. The heat-transfer interface between a back side of the substrate and the mounting surface of the chuck body forms a first part of the separately pressurizable region; and a chamber (e.g., a gas cavity) bounded by the intermediate sealing structure, the chuck body, and the substrate forms a second part of the separately pressurizable region. The free exchanges of gas based on a gas flow pass between the first and second parts of the region.

The intermediate sealing structure, which can take varied forms, isolates the separately pressurizable region from the rest of the evacuated space of the processing chamber independently of any contact between the chuck body and the substrate. However, the mounting surface preferably includes a flat area that contacts a central portion of the substrate for enhancing thermal transfers between the chuck body and the substrate. Channels formed in the flat area of the mounting surface promote a free flow of gas within the heat-transfer interface. The channels are preferably arranged in a pattern including a combination of radial and circular or square grooves. Some of the channels preferably extend through the periphery of the heat-transfer interface to support the free flows of gas between the two parts of the separately pressurizable region (i.e., between the heat-transfer interface and the surrounding chamber).

At least one conduit is connected to the separately pressurizable region to control gas pressures within the region, particularly at the heat-transfer interface. Preferably, separate inlet and outlet conduits are connected to the two parts of the separately pressurizable region for promoting flows between the two parts. For example, the conduit utilized for controlling gas pressure at the heat-transfer interface can function solely as an outlet conduit for exhausting gas flowing into the heat transfer interface.

The intermediate sealing structure preferably includes a portion of a first seal joining the intermediate sealing structure to the substrate and a portion of a second seal joining the intermediate sealing structure to the chuck body. The first seal can be positioned for engaging either a front surface of the substrate, which is otherwise exposed to process gas pressure in the processing chamber, or a back surface of the substrate, which is otherwise exposed to higher gas pressure within the separately pressurizable region. The second seal can join the intermediate sealing structure either directly to a heat-conducting portion of the chuck body or indirectly through a thermal insulator or an extended portion of the chuck body not used for similar heat transfers or substrate support. The intermediate structure itself can also be made from a thermal insulating material such as a ceramic or resin material to thermally isolate the intermediate structure from the heat-conducting portion of the chuck body.

Since the intermediate sealing structure is interposed between the heat-conducting portion of the chuck and the first seal, more options are available for regulating temperatures at the first seal. For example, using thermal insulating materials, the intermediate sealing structure can function as a thermal insulator during heating operations to reduce substrate temperature disturbances at the first seal. However, the intermediate sealing structure can also function as a conductor during cooling operations. The area of the intermediate sealing structure exposed to gas within the separately pressurizable region and the proximity of the intermediate sealing structure to the heat-conducting portion of the chuck body are other design variables that can be used to regulate thermal conduction of the intermediate sealing structure.

One example of such an intermediate sealing structure is a modified mechanical clamp that otherwise functions to press the substrate against the mounting surface of the chuck body. A first sealing surface of the clamp engages the front surface of the substrate around its entire periphery and a second sealing surface of the clamp engages the chuck body. Preferably, one of the sealing surfaces is mounted from a flexible portion of the clamp or engages a flexible sealing surface of the chuck body to accommodate slight variations in substrate thickness and dimensional tolerances of the chuck.

The intermediate sealing structure can also be formed by a peripheral support surrounding the chuck body. A first sealing surface of the peripheral support engages the back surface of the substrate in a position beyond the heat-transfer interface. A second sealing surface joins the peripheral support to the chuck body. In this arrangement, the mounting surface can be built up from alternating layers of electrically conductive and non-conductive films to form an electrostatic clamp for drawing the substrate against both the mounting surface and the peripheral support.

DRAWINGS

DETAILED DESCRIPTION

Figure 1:
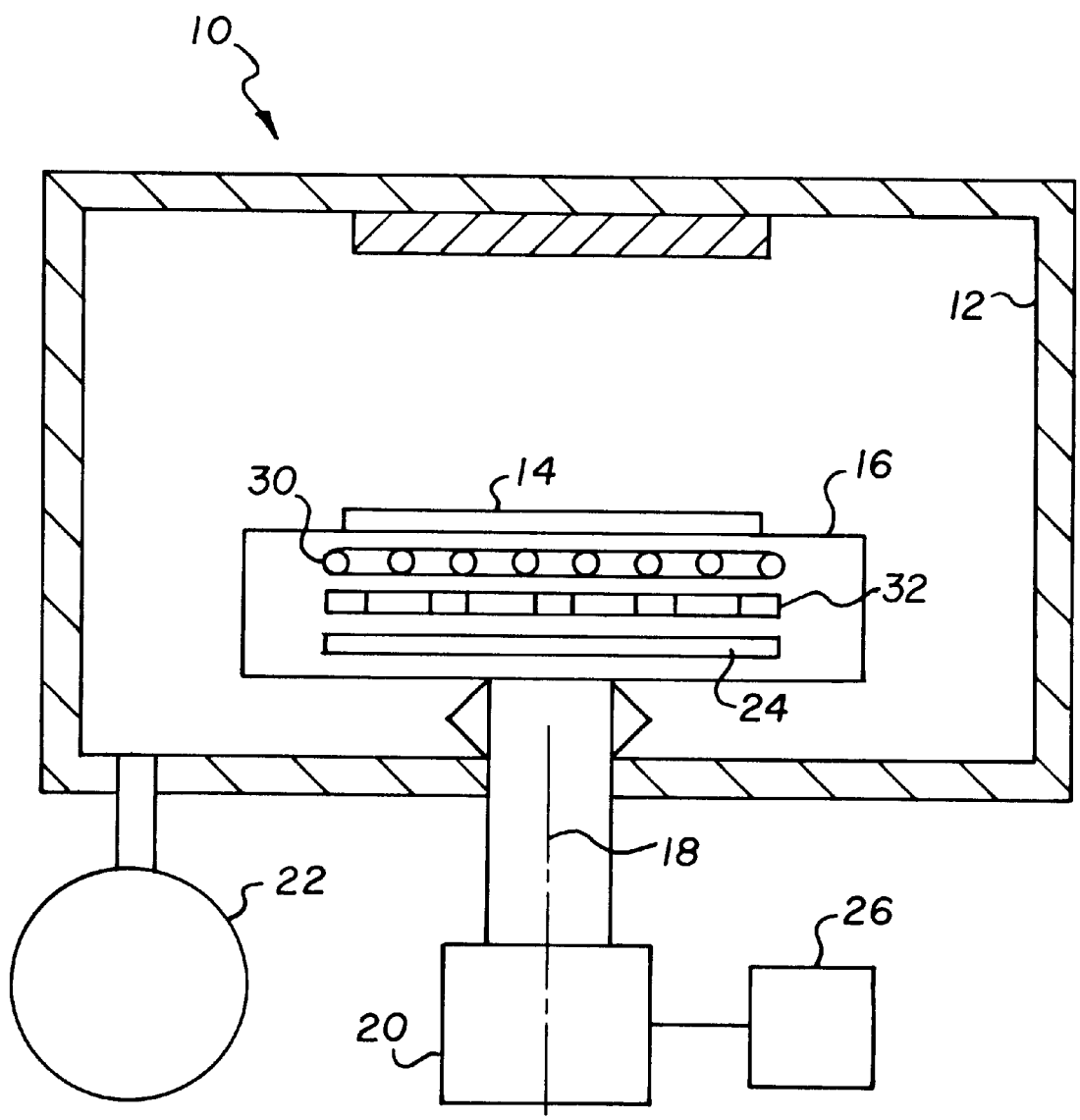
FIG. 1 is a schematic cross-sectional view of a vacuum processing chamber in which a substrate is mounted on a chuck that is adjustable in height within the processing chamber.

A vacuum processor 10, which is depicted schematically in FIG. 1, includes a vacuum processing chamber 12 for processing a substrate 14. A chuck 16 supports the substrate 14 within the vacuum processing chamber 12 in adjustable height positions that can be varied along a reference axis 18. A drive mechanism 20 moves the chuck 16 together with the substrate 14 along the reference axis 18 for positioning the substrate 14 within the processing chamber 12.

A pump 22 evacuates the processing chamber 12 for supporting operations that are best performed in a low pressure or near vacuum environment. For example, the vacuum processor 10 is intended for operations such as physical vapor deposition (PVD), including ionbeam deposition and plasma-assisted sputtering, chemical vapor deposition (CVD), metal-organic chemical vapor deposition (MOCVD), and plasma-enhanced chemical vapor deposition (PECVD)—all of which deposit material layers on the substrate 14. Other exemplary treatment operations affecting the substrate or the deposited materials include thermal planarization, annealing, plasma etching, and substrate cleaning.

Various electrical and magnetic fields (DC or AC) can be used for initiating or controlling the substrate processing operations. In the vicinity of the substrate 14, a magnetic field can be used for orienting magnetic materials that are deposited on the substrate (e.g., magnetic data storage thin-film head), and an electrical bias (DC or RF) can be used for enhancing or otherwise regulating the impact of ions on the substrate 14. Polarities of the various electrical or magnetic fields can also be varied to further influence operations. For example, the chuck 16 contains a plate-shaped electromagnet 24 for supporting substrate processing operations requiring a magnetic field in the vicinity of the substrate 14 for insitu magnetic orientation and is also connected to an RF generator 26 for supporting processing operations requiring an electrical bias.

Also within the chuck 16 are two temperature regulators, namely, a heating element 30 and a cooling element 32. The heating element 30 enables operations requiring controlled substrate heating at elevated substrate temperatures, and the cooling element 32 supports operations requiring withdrawal of excess heat from the substrate 14 or the chuck body 16. Together, the heating and cooling elements 30 and 32 can optimize substrate temperatures and facilitate precise substrate temperature control throughout various stages of processing that are best performed at particular temperatures or rates of temperature change. Further details of a chuck containing both heating and cooling elements are disclosed in co-assigned U.S. application Ser. No. 08/560,344, filed Nov. 17, 1995, now U.S. Pat. No. 5,775,416, which is hereby incorporated by reference.

This invention, which relates to transfers of heat between the substrate 14 and the chuck 16 for the purpose of substrate heating or cooling, can be practiced with different combinations of these components for supporting particular processing operations. For example, only the heating element 30 or only the cooling element 32 may be incorporated into the chuck 16 to support operations requiring either heating or cooling. In fact, the chuck 16 itself could be used as a heat sink independent of any other temperature regulator.

Figure 2:
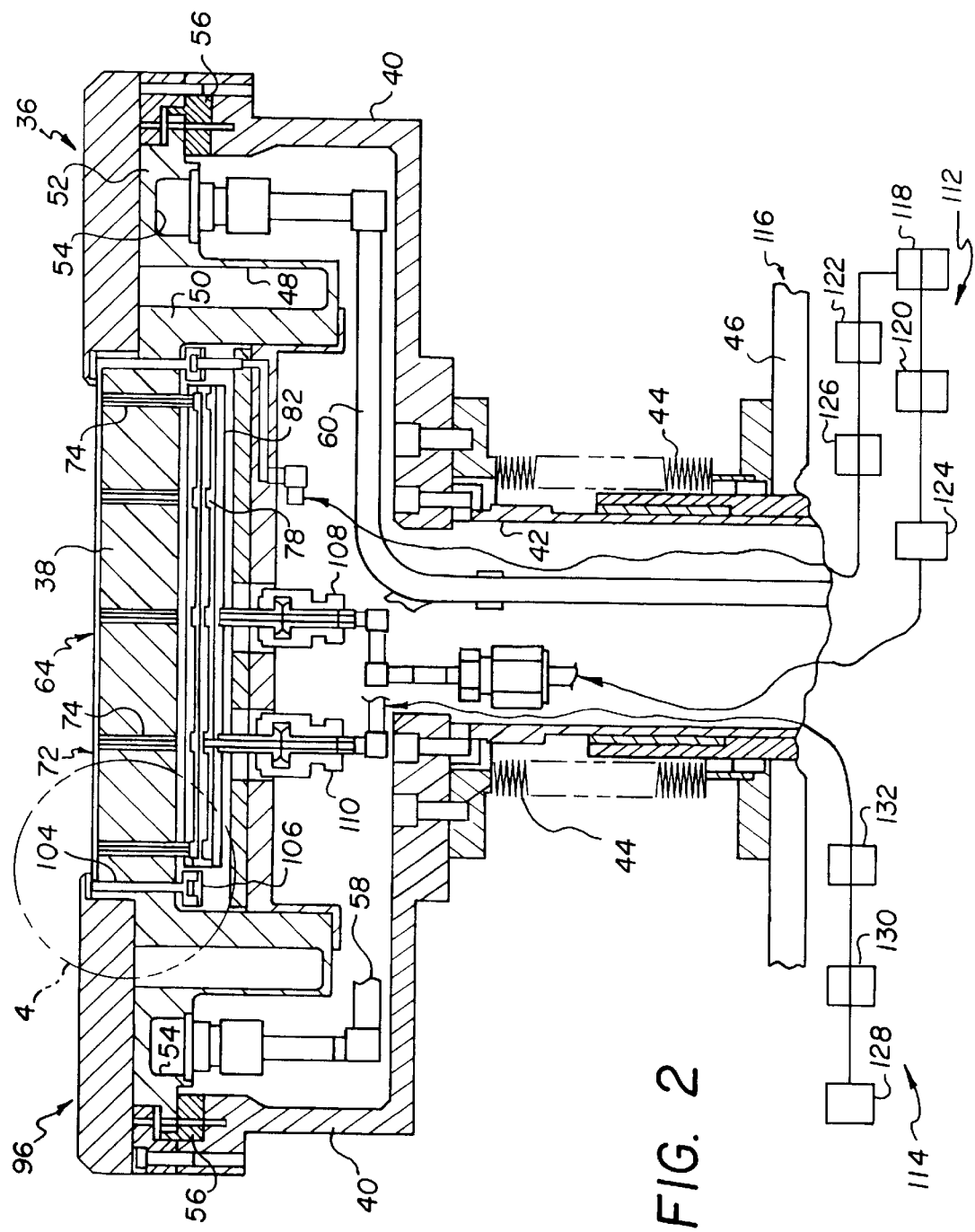
FIG. 2 is a more detailed cross-sectional view of an exemplary chuck having means for supporting an uninhibited flow of gas through a periphery of the substrate-chuck interface. The vacuum processing chamber is broken away, and gas flow controls are shown schematically.
Figure 3:
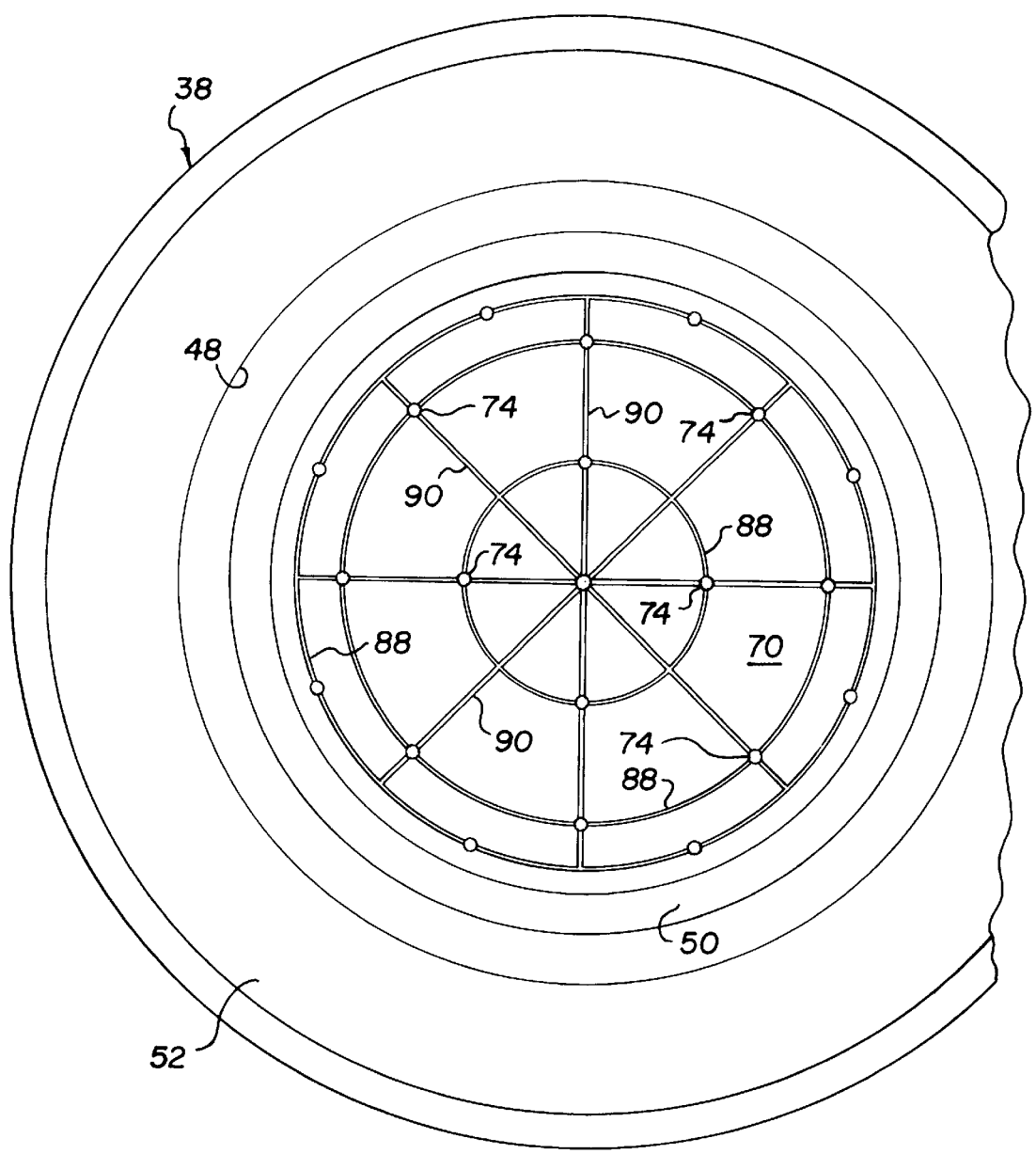
FIG. 3 is a top view of the chuck shown in FIG. 2 with a mechanical clamp removed to show underlying features, including channels formed in a chuck mounting surface to enable free flows of gas through the periphery of the substrate-chuck interface.
Figure 4:
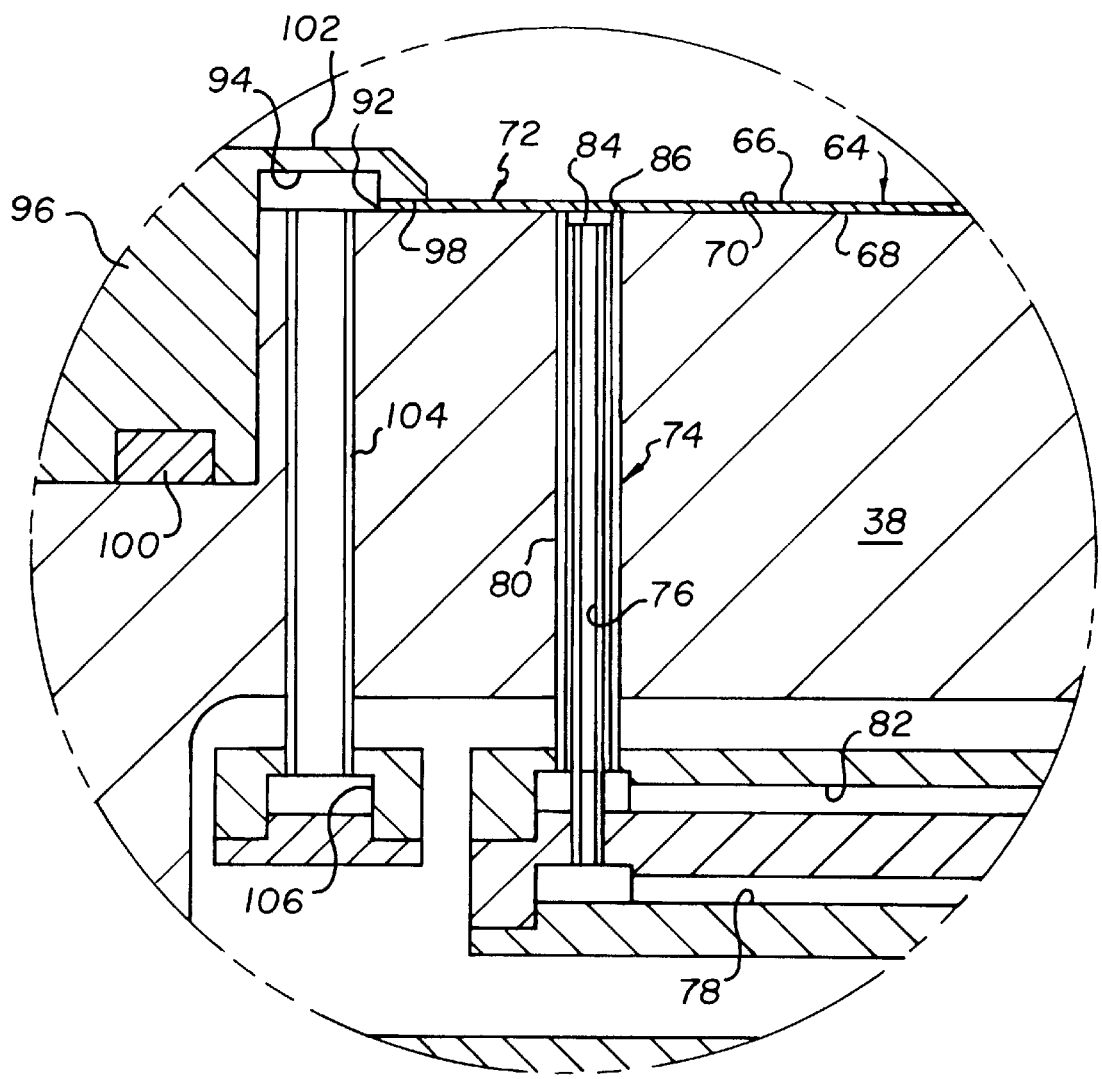
FIG. 4 is an enlarged partial view of FIG. 2 showing a region of engagement between the mechanical clamp, the substrate, and the chuck body as well as gas inlet and outlet conduits which convey the gas to and from the chuck body.

More detailed views of an exemplary chuck 36 for carrying out this invention are shown in FIGS. 2–4. The chuck 36 has a chuck body 38, a shroud or chuck housing 40, and a support and utilities feedthrough column 42. Bellows 44 surround the support column 42 for sealing the shroud 40 to a bottom plate of a processing chamber 46, which is only partially shown.

Within the chuck body 38 (made of metal or a metallic alloy), a thin-walled trough 48 thermally separates inner and outer portions 50 and 52 of the chuck body 38. The thin-walled trough 48 minimizes heat transfer or heat loss from the inner portion 50 of the chuck body 38 to the water-cooled and vacuum sealed outer portion 50 of the chuck body 36. An annular coolant passage 54 lowers temperatures of the outer portion 52 of the chuck body 38 for protecting a seal 56 between the chuck body 38 and the shroud 40, particularly during substrate heating operations. Conduits 58 and 60 carry coolant, such as cooling water, to and from the annular passage 54 within a conventional coolant circulatory system, the rest of which is not shown.

A substrate 64, such as a silicon wafer or a thin-film head substrate, having a front surface 66 and a back surface 68 is supported in contact or in proximity with a mounting surface 70 of the chuck body 38, forming between them an interface 72 through which heat can be transferred between the chuck body 38 and the substrate 64. The mounting surface 70 is substantially flat, matching the shape of the back surface 68 of the substrate 64 for minimizing any space separating the two surfaces 68 and 70. The mounting surface 70 can also have a small global curvature for improved substrate-to-chuck contact upon clamping.

An array of concentric conduits 74 conveys an uninhibited flow of gas to and from the heat-transfer interface 72 for enhancing transfers of heat between the inner portion 50 of the chuck body 38 and the substrate 64. Each of the concentric conduits 74 includes an inner conduit 76, which is connected to an inlet gas manifold 78, and an outer conduit 80, which is connected to an outlet gas manifold 82. A top end 84 of the inner conduit 76 is preferably recessed with respect to a top end 86 of the outer conduit 80 to minimize flow resistance between the two top ends 84 and 86 at the heat-transfer interface 72. A single-tube conduit can be used instead of the array of concentric conduits 74 anywhere throughout the inner portion 50 of the chuck body 38 under the substrate 64 (e.g., at the center of the chuck body).

A plurality of circumferential and radial channels 88 and 90 formed in the mounting surface 70 supports flows of gas throughout the heat-transfer interface 72. The circumferential and radial channels 88 and 90 intersect each other and the concentric conduits 74. The radial channels 90 also extend through a periphery 92 of the heat-transfer interface 72 into an annular chamber 94 bounded by a mechanical clamp 96, the chuck body 38, and the substrate 64.

The mechanical clamp 96, which also maintains the substrate 64 against the mounting surface 70, functions as an intermediate sealing structure for isolating the annular chamber 94 and with it the heat-transfer interface 72 from the remaining evacuatable space within the processing chamber 46 including the active processing regions. A first seal 98 joins the mechanical clamp 96 to the front surface 66 of the substrate 64, and a second seal 100 joins the mechanical clamp 96 to the chuck body 38. Although shown in engagement with the inner portion 50 of the chuck body 38, the seal 100 is more preferably engaged with the outer (thermally isolated) portion of the chuck body 38. The two seals 98 and 100 are relatively adjustable in height to accommodate different mounting positions of the clamp 96 associated with thickness variations among substrates and dimensional tolerances of the chuck components. For example, a cantilevered portion 102 of the clamp 96 can be made sufficiently flexible to provide the required adjustment. The seals 98 and 100 themselves can also be arranged to provide such flexibility, such as by employing an oversized elastomer O-ring for the seal 100.

The annular chamber 94 and the heat-transfer interface 72 form two portions of a separately pressurizable region within the vacuum chamber 46. One or more single conduits 104 connect the annular chamber 94 to a manifold 106, which can be arranged as either an input or output manifold depending on the desired direction of flow between the annular chamber 94 and the heat-transfer interface 72. As an input manifold, increased pressure in the manifold 106 directs flows into the annular chamber 94 and through the periphery 92 of the heat-transfer interface 72. The concentric conduits 76 convey a net flow from the heat-transfer interface 72. As an output manifold, reduced pressure in the manifold 106 directs a net flow through the concentric conduits 76 into the heat-transfer interface 72 and through its periphery 92 into the annular chamber 94, where it is withdrawn through the single-tube conduits 104.

Fluid (gas) couplings, such as the illustrated couplings 108 and 110 to the manifolds 78 and 82, connect each of the manifolds 78, 82, and 106 to separate groups of controls 112, 114, and 116 for regulating flows of fluid into or out of the manifolds 78, 82, and 106. Though depicted only schematically, the controls 112 and 116 function as conventional inlet controls for regulating gas flows into the manifolds 78 and 106, and the controls 114 function as conventional outlet controls for regulating gas flows out of the manifold 82. The inlet controls 112 and 116 include, for example, a common gas supply 118 but separate mass flow control valves 120 and 122 and pressure gauges 124 and 126. The outlet controls 114 include a vacuum pump 128, a throttle (or adjustable conductance) valve 130, and a pressure gauge 132. A processor (not shown) monitors pressures sensed by the gauges 124, 132, and 126 and controls the valves 120, 130, and 122 for maintaining desired gas pressures of gas flow rates in the respective manifolds 78, 82, and 106.

A continuous flow of an inert gas (such as argon, helium, or xenon) or another suitable gas (such as nitrogen, or hydrogen) is preferably maintained through the heat-transfer interface 72 and annular chamber 94 so that variations in the flow rates into and out of the manifolds 78, 82, and 106 can be used to make rapid changes or adjustments in pressure throughout the heat-transfer interface 72 and the annular chamber 94. Although the gas pressures at the heat-transfer interface 72 and the annular chamber 94 are higher than those in the remaining evacuatable space of the processing chamber 46, these pressures are preferably kept to a minimum required (e.g., between 1 Torr and 10 Torr) to support the desired heat transfers between the chuck body 38 and the substrate 64 while avoiding excess gas leakage through the seals 98 and 100.

For simplicity, a temperature regulator is not shown in the drawing FIGS. 2–4. However, a heating element, a cooling element, or both heating and cooling elements can be incorporated into the chuck body 38 for regulating the temperature of the substrate 64. The mechanical clamp 96, which functions as an intermediate sealing structure, can be either thermally coupled to or thermally isolated from the chuck body 38. For substrate cooling operations, the clamp 96 can be made of a high thermally conductive material or a low thermally conductive material. Generally, sealing is more difficult at higher chuck and substrate temperatures—so the clamp 96 is preferably thermally isolated from the chuck body for heating operations. In order to minimize the heat-sinking effect of the mechanical clamp 96, a contacting portion of the clamp can be made from a thermal insulating material, such as a ceramic or resin material or other low-thermal-conductivity materials.

Thermal coupling of the clamp 96 to the chuck body 38 can be enhanced in several ways including making the clamp of a heat-conducting material or increasing the amount of common area in proximate contact between the chuck body 38 and the clamp 96. Thermal isolation of the clamp 96 can be accomplished conversely. For example, the clamp 96 can be made of a thermal insulating material or a low-thermal-conductivity material can be used to separate the clamp 96 from contact with the chuck body 38. Similarly, the spacing between the chuck body 38 and the clamp 96 can be increased.

The configuration of the conduits 74 and 104 can also be changed for particular purposes. For example, either or both of the conduits 74 and 104 can be single tube or concentric double-tube conduits. The single conduits can be used to connect separate inlet or outlet manifolds to the heat-transfer interface 72 and the annular chamber 94 for controlling directions of gas flow through the periphery 92 of the heat-transfer interface 72.

Figure 4A:
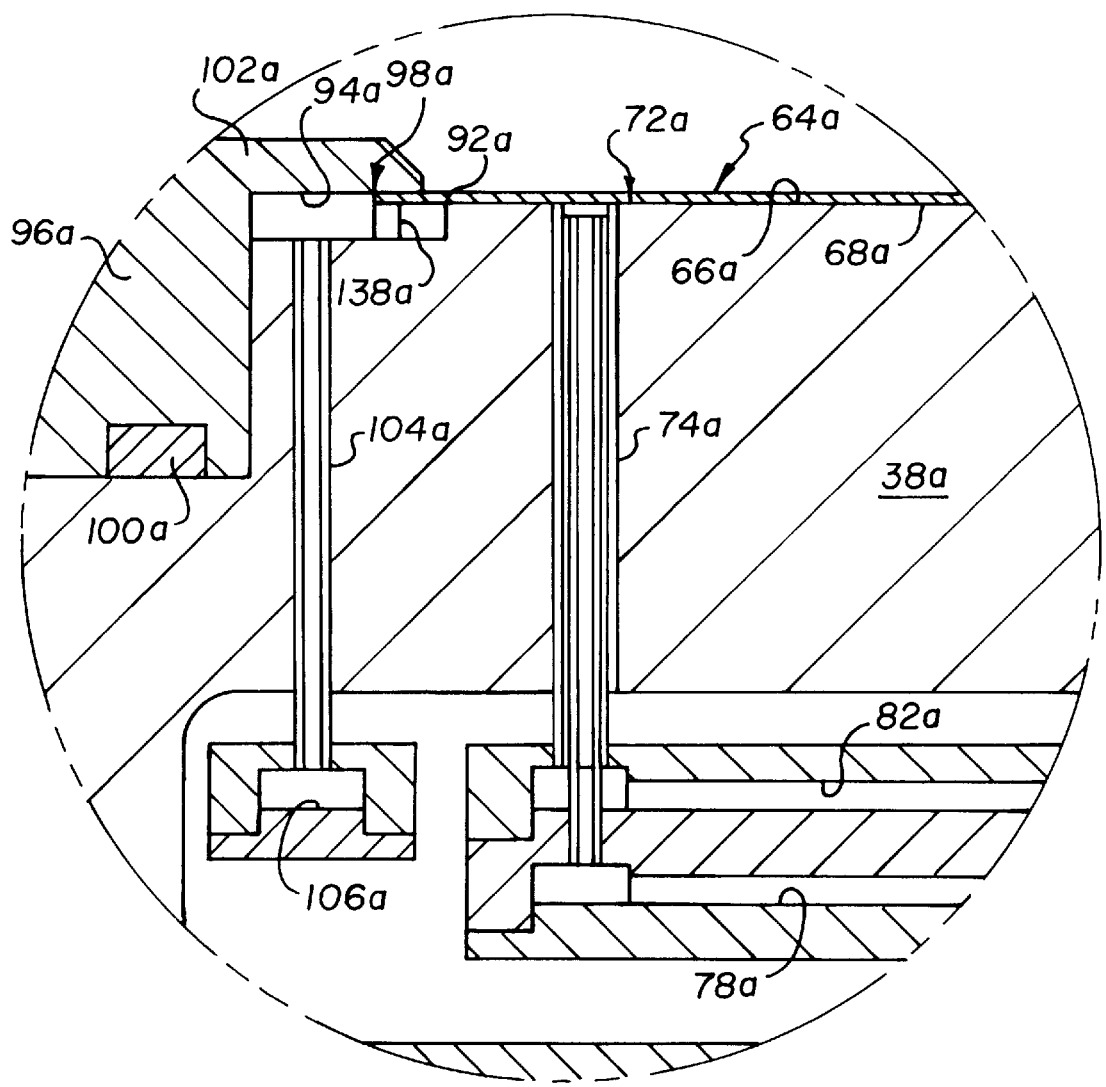
FIG. 4A is a similar partial view showing an alternative engagement region with edge support posts projecting from a recess in the chuck body.
Figure 4B:
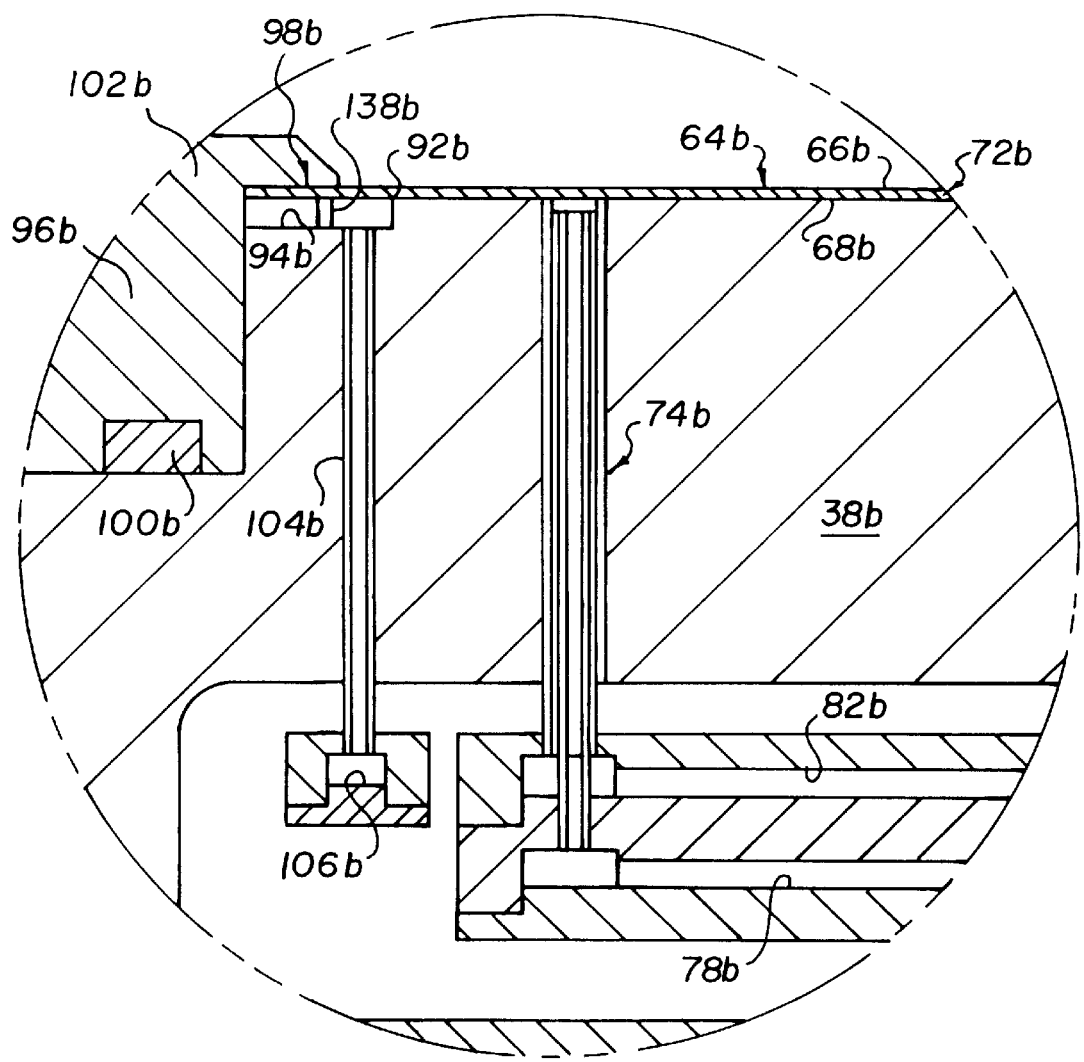
FIG. 4B is a similar partial view showing another alternative engagement region.

The annular chamber 94 can also be constructed in a variety of different ways as illustrated in FIGS. 4A and 4B. Corresponding structures are referenced by the same numerals but are distinguished by the letters "a" and "b" for the different embodiments. For example, alternative annular chamber 94a is formed as a recess in chuck body 38a. The annular chamber 94a extends beneath substrate 64a exposing a peripheral portion of its back surface 68a to gas within the chamber 94a. Posts 138a support the overhung portions of the substrate 64a against a clamping force imparted by mechanical clamp 96a to front surface 66a of the substrate 64a.

Unlike cantilevered portion 102a of the clamp 96a, which forms a continuous first seal 98a surrounding the substrate 64a, the posts 138a are circumferentially spaced to permit free flows of gas between them. Alternative structures such as slotted rims can also be used to similarly support the substrate 64a without inhibiting flow between the periphery 92a of the heat-transfer interface 72a and conduits 106a. The posts 138a can be made from either high-thermal-conductivity or low-thermal-conductivity materials to suit different operations. However, the posts 138a are preferably made of the same material and integral with the chuck body 38a.

Alternative annular chamber 94b is formed entirely beneath substrate 64b. Posts 138b similarly support the overhung portion to the substrate 64b. Conduits 104b are connected to the annular chamber 94b between the posts 138b and the periphery 92b of the heat-transfer interface 72b. Although the posts 138b are not positioned to obstruct flows between the heat-transfer interface 72b and the conduits 104b, the posts 138b are still preferably spaced to permit free flows of gas between them to expose the entire back surface 68b of the substrate 64b to the gas through an uninhibited flow.

Figure 5:
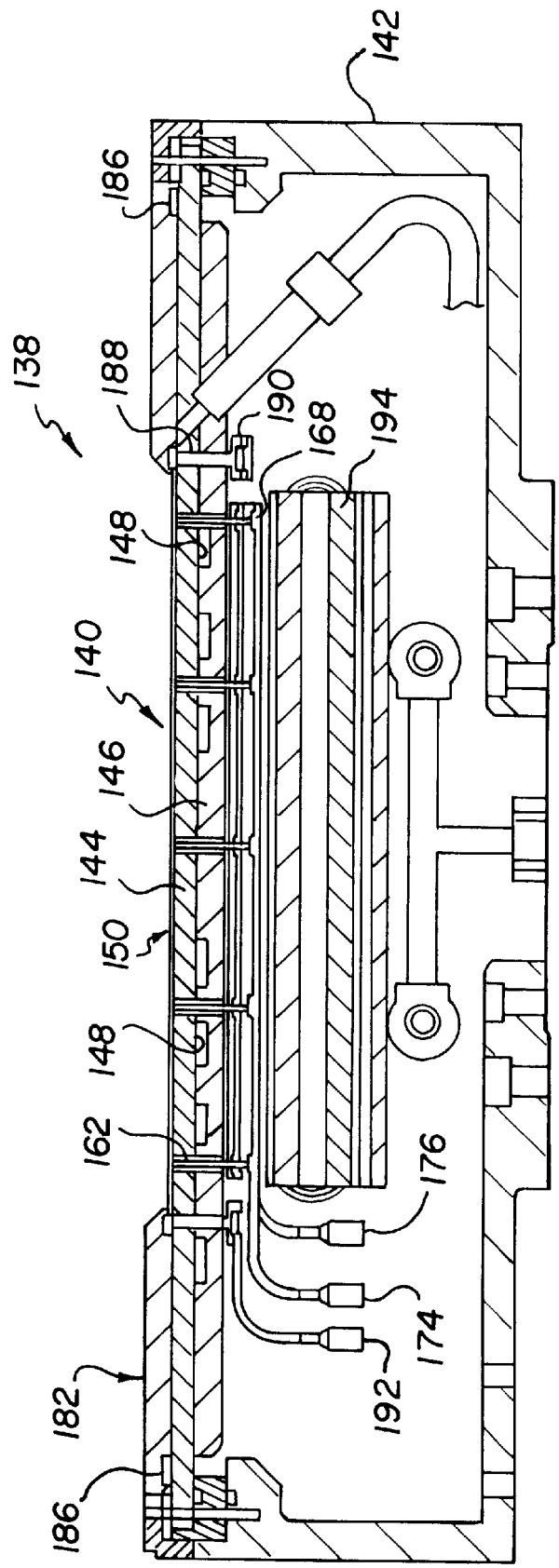
FIG. 5 is a cross-sectional view of an alternative chuck specifically arranged for cooling substrates and having an electromagnet that can be used for magnetically orienting magnetic films.
Figure 6:
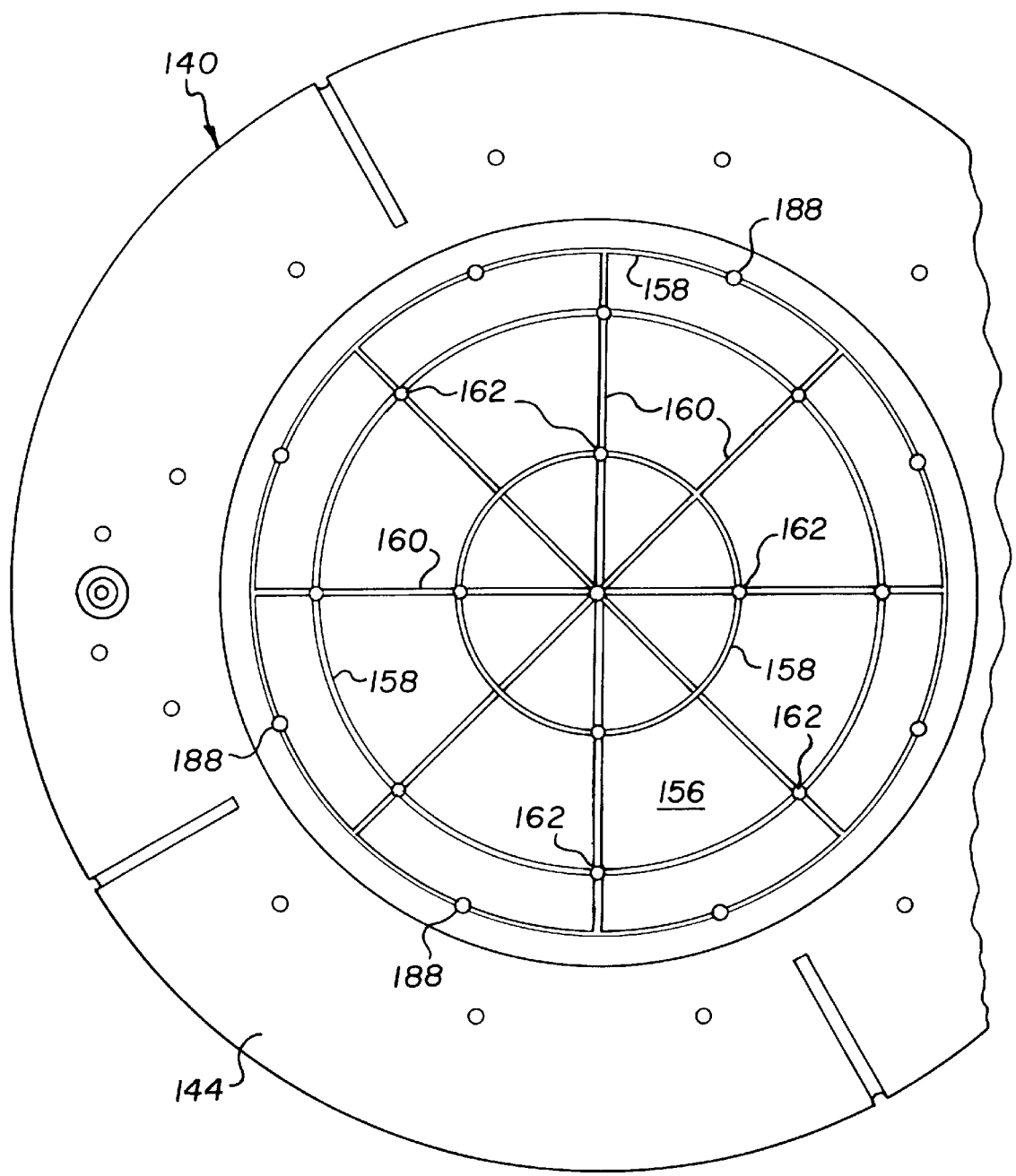
FIG. 6 is a top view of the body of the chuck shown in FIG. 5 with a mechanical clamp removed to show underlying features including an arrangement of grooves similar to FIG. 3.
Figure 7:
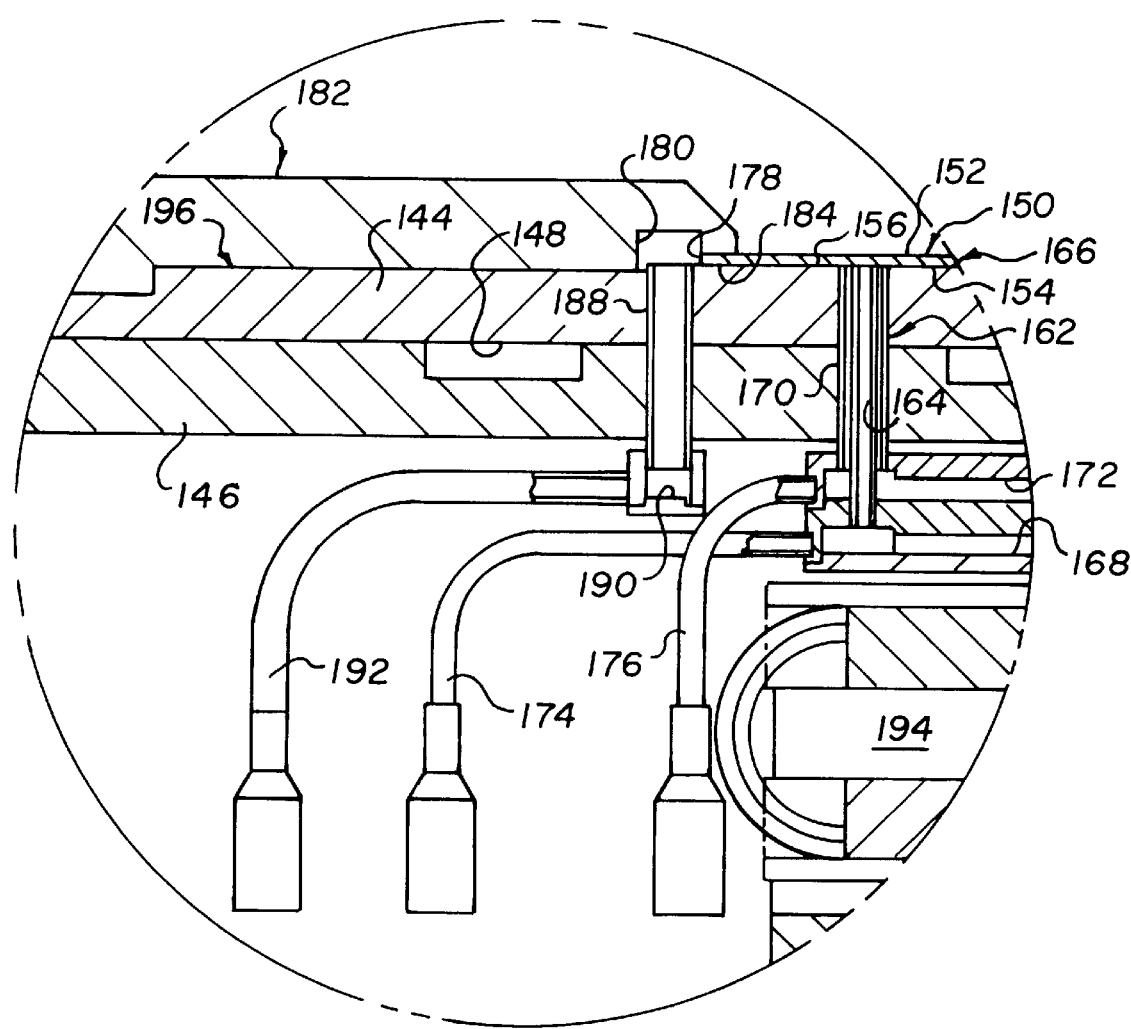
FIG. 7 is an enlarged partial view of FIG. 5 showing a region of engagement between the clamp, the substrate, and the chuck body, as well as inlet and outlet conduits for dispensing and collecting gas flowing through the substrate-chuck interface.

An alternative chuck 138 depicted by FIGS. 5–7 is adapted more specifically for cooling substrates. The chuck 138 has a heat-conducting body 140 and a surrounding shroud 142. (A support column with baffles connecting the chuck 138 to a processing chamber is not shown.) The heat-conducting body 140 is formed by top and bottom plates 144 and 146 connected together by a brazing process. Channels 148 formed between mating surfaces of the plates 144 and 146 circulate coolant through the chuck body 140. A conventional coolant circulating system (not shown) can be used to control the flow or temperature of coolant through the channels 148.

A substrate 150 has a front surface 152 exposed to evacuated space within a processing chamber (not shown) and a back surface 154 positioned in contact with a mounting surface 156 of the chuck body 140. Except at circumferential and radial channels 158 and 160 formed in the mounting surface 156, the back surface 154 of the substrate 150 is substantially contiguous with the mounting surface 156, forming between them a heat-transfer interface 166 for transferring heat between the chuck body 140 and the substrate 150.

Similar to the preceding embodiments, concentric conduits 162 deliver flows of gas to and from the heat-transfer interface 166. Inner conduits 164 connect the heat-transfer interface 166 to an inlet manifold 168, and outer conduits 170 connect the heat-transfer interface 166 to an outlet manifold 172. Lines 174 and 176 connect the manifolds 168 and 172 to conventional flow controls, which are not shown.

The circumferential and radial channels 158 and 160 in the mounting surface 156 assure the rapid circulation and uninhibited flow of gas throughout the heat-transfer interface 166. The radial channels 160 extend through a periphery 178 of the heat-transfer interface 166 into communication with a surrounding annular chamber 180. Most of the annular chamber 180 is formed by a recess or groove in a mechanical clamp 182, which is otherwise intended to press the substrate 150 into contact with the chuck body 140.

The mechanical clamp 182 forms a first seal 184 with the front surface 152 of the substrate 150 at the substrate periphery and a second seal 186 with the chuck body 140. The two seals 184 and 186 isolate the annular chamber 180 and the heat-transfer interface 166 from the remaining evacuatable space within the processing chamber (not shown). Some flexibility is provided between the seals 184 and 186 to accommodate thickness differences between substrates and dimensional tolerances of the chuck components. Flows of fluid can be delivered to or from the annular chamber through single-tube conduits 188 that connect the annular chamber 180 to a manifold 190. A line 192 connects the manifold 190 to a gas flow control device (not shown).

Pressures in the lines 174, 176, and 192 can be controlled to regulate not only pressures at the heat-transfer interface 166 and the annular chamber 180 but also the direction of flow through the periphery 178 of the heat-transfer interface 166. For example, the manifold 190 can be used as an outlet manifold for directing flows from the heat-transfer interface 166 to the annular chamber 180 or as an inlet manifold for directing flows from the annular chamber 180 to the heat-transfer interface 166.

The mechanical clamp 182 can be thermally coupled to the chuck body 140 to prevent excess substrate heating during plasma processing operations that transfer heat to the mechanical clamp 182. Most of the thermal transfer between the mechanical clamp 182 and the chuck body 140 takes place through a contiguous interface 196 that extends within the annular chamber 180 between the first and second seals 184 and 186. The mechanical clamp 182 is also preferably made of a heat-conducting material to also equalize temperatures throughout the rest of the clamp 182. It is also possible to make the clamp 182 from a thermal insulating or a low-thermal-conductivity material.

The chuck 138 can also be adapted for use with various electric or magnetic field controls for further affecting substrate processing. For example, a plate-shaped electromagnet 194 is positioned next to the inlet manifold 168 to produce a uniaxial magnetic field in the vicinity of the substrate 150 for orienting domains of magnetic material on the substrate's front surface 152 during processing of magnetic materials.

Figure 8:
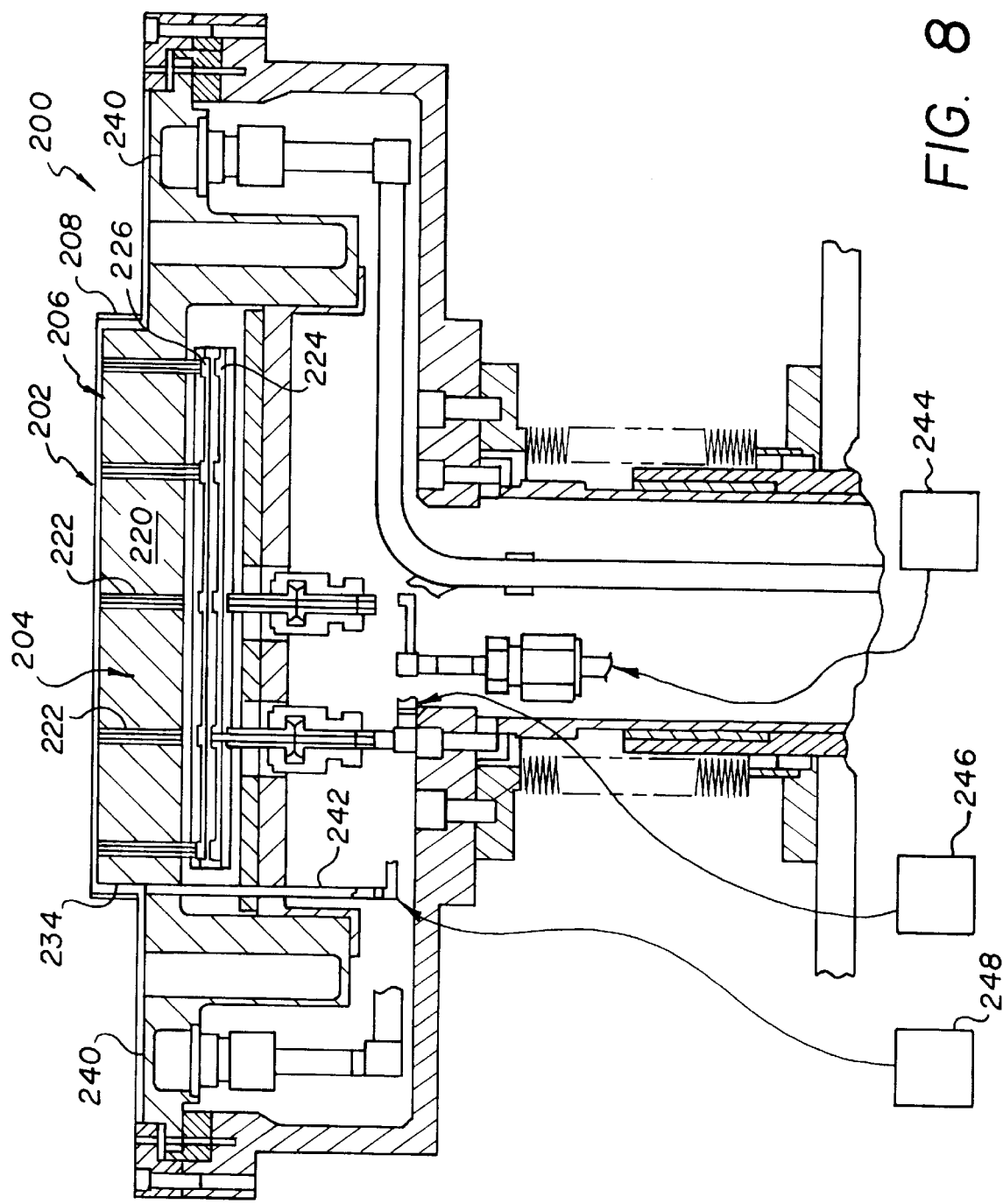
FIG. 8 is a cross-sectional view of another alternative chuck having an electrostatic clamp for securing substrates.
Figure 9:
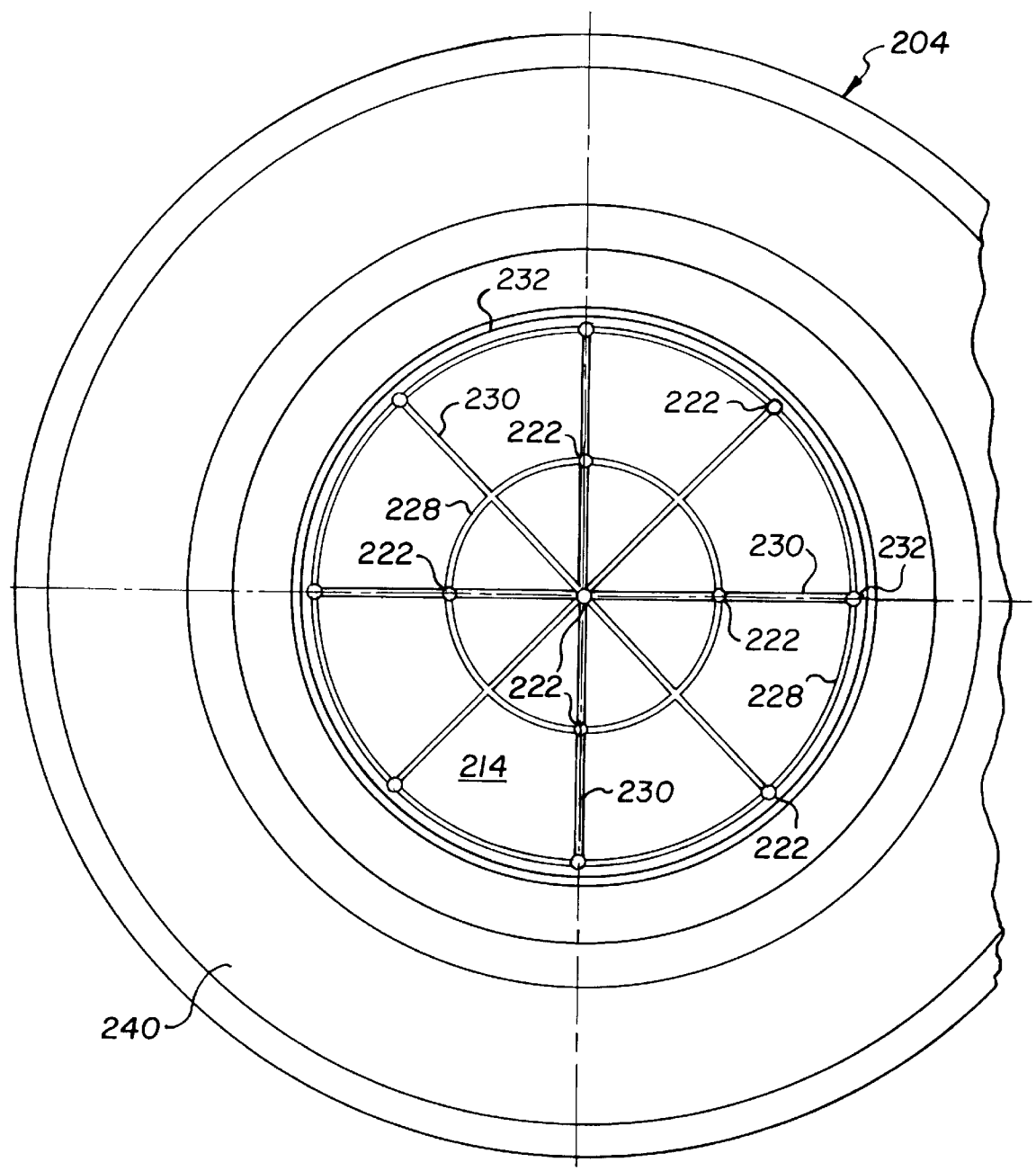
FIG. 9 is a top view of the chuck shown in FIG. 8 with an electrostatic clamp having surface channels that enable free flows of gas through the periphery of the substrate-chuck interface.
Figure 10:
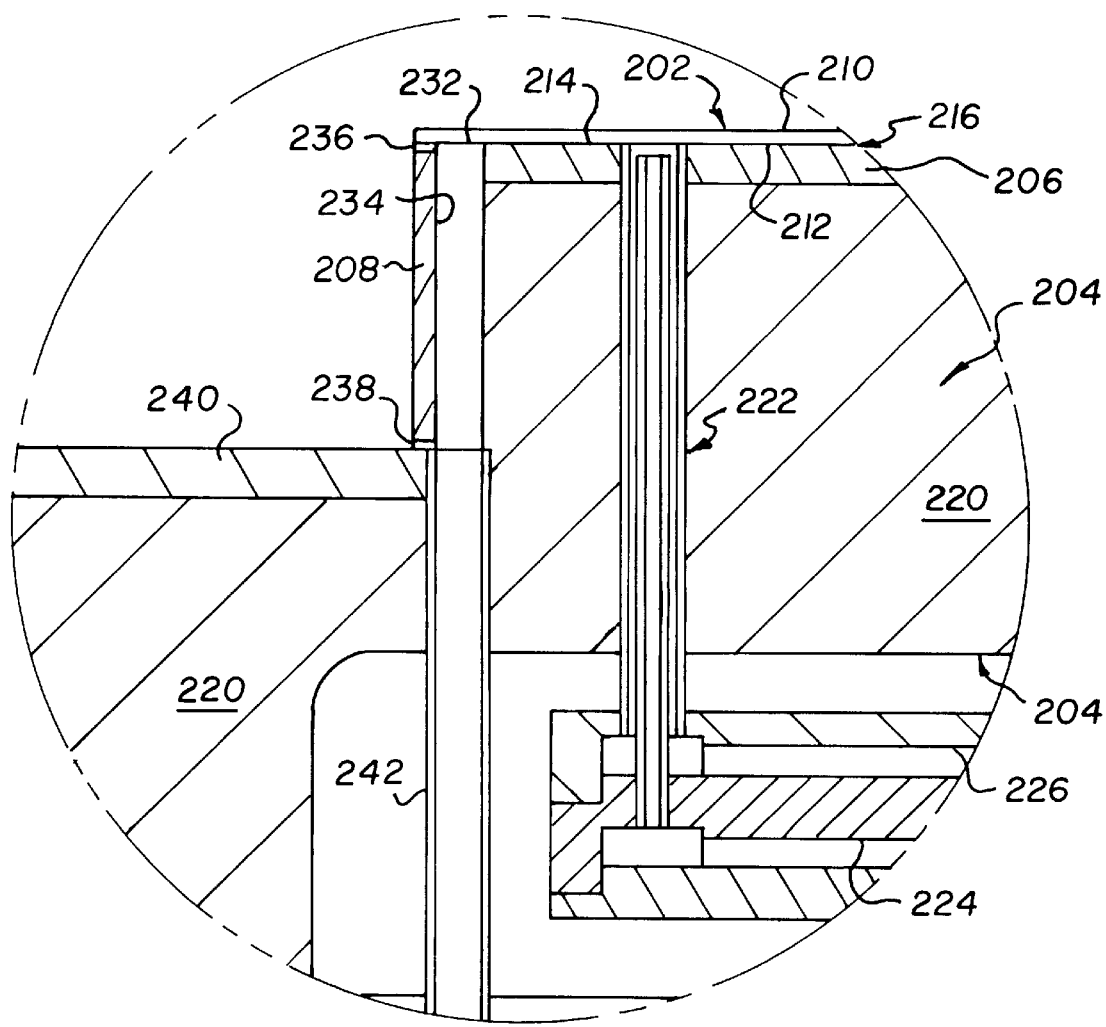
FIG. 10 is an enlarged partial view of FIG. 8 showing a region of engagement between the clamp, the substrate, and the chuck body, and also showing inlet and outlet conduits for dispensing and collecting gas flowing through the substrate-chuck interface.

The next set of drawing figures, FIGS. 8–10, depict an alternative chuck 200, which uses a different means for mounting a substrate 202 on a chuck body 204 and for sealing a space between the substrate 202 and the chuck body 204. An electrostatic clamp 206 secures the substrate 202 to the chuck body 204 and a separate peripheral support structure 208 seals the periphery of the substrate 202 to the chuck body 204.

The substrate 202 includes front and back surfaces 210 and 212. A mounting surface 214 of the electrostatic clamp 206 is substantially contiguous with a central portion of the substrate's back surface 212. The overlapping areas of the substrate's back surface 212 and the mounting surface 214 form a heat-transfer interface 216 for transferring heat between the substrate 202 and a heat-conducting portion 220 of the chuck body 204. The peripheral support 208, which is preferably spaced from the heat-conducting portion 220, engages an overhung area of the substrate's back surface 212 and does not contribute to active heating or cooling of the substrate 202.

Similar to the other embodiments, concentric conduits 222 convey gas between the heat-transfer interface 216 and inlet and outlet manifolds 224 and 226. Circumferential and radial grooves 228 and 230 formed in the mounting surface 214 provide for flowing the gas throughout the heat-transfer interface 216. The radial grooves 230 also extend through a periphery 232 of the heat-transfer interface 216 into an annular chamber 234 that surrounds the heat-transfer interface 216.

The annular chamber 234 is bounded by the substrate 202, the chuck body 204, and the peripheral support structure 208, which functions as an intermediate sealing structure. A first seal 236 formed at a top rim of the peripheral support 208 joins the peripheral support 208 to the substrate's back surface 212 at a periphery of the substrate 202. A second seal 238 formed at a bottom rim of the peripheral support 208 joins the peripheral support 208 to a non-conducting portion 240 or other extension of the chuck body 204.

In comparison to the intermediate sealing structure of the immediately preceding embodiment, the peripheral support 208 is thermally isolated from the heat-conducting portion 220 of the chuck body 204 and does not contribute to the active heating or cooling of the substrate. Features that contribute to the thermal isolation include the physical spacing of the peripheral support 208 from the heat-conducting portion 220 of the chuck body 204 and the non-conducting (extended or thermally isolated) portion 240 of the chuck body 204 that separates the second seal 238 from the heat-conducting portion 220. The peripheral support 208 can also be made of a non-conducting material, such as ceramic, for further isolating the first seal 236.

The annular chamber 234 itself functions as a gas manifold so that only a single conduit 242 is needed to regulate flows to and from the annular chamber 234. The inlet and outlet manifolds 224 and 226, as well as the single conduit 242 from the annular chamber 234, are connected to separate flow controls 244, 246, and 248. Similar to the other embodiments, flows between the annular chamber 234 and the heat-transfer interface 216 are controlled by the separate flow controls 244, 246, and 248. Also similar to the other embodiments, the concentric and single-tube conduits can be used in place of each other as long as the desired flow requirements are met.

The electrostatic clamp 206, which is made from layers of patterned electrically conductive and blanket non-conductive materials, is preferably joined to the chuck body 204 by a bonding or brazing process. Both are preferably thermally conductive to minimize any resistance to heat transfers between the heat-conducting portion 220 and the substrate 202. An attractive force exerted by the electrostatic clamp 206 presses the substrate 202 onto the chuck body 204. However, just prior to contacting the chuck body 204, the substrate 202 contacts the peripheral support 208 for engaging the first seal 236. Preferably, either the substrate 202 or one of the first and second seals 236 or 238 is sufficiently flexible to permit the central portion of the substrate's back surface 212 to contact the mounting surface 214 of the chuck body 204.

Figure 11:
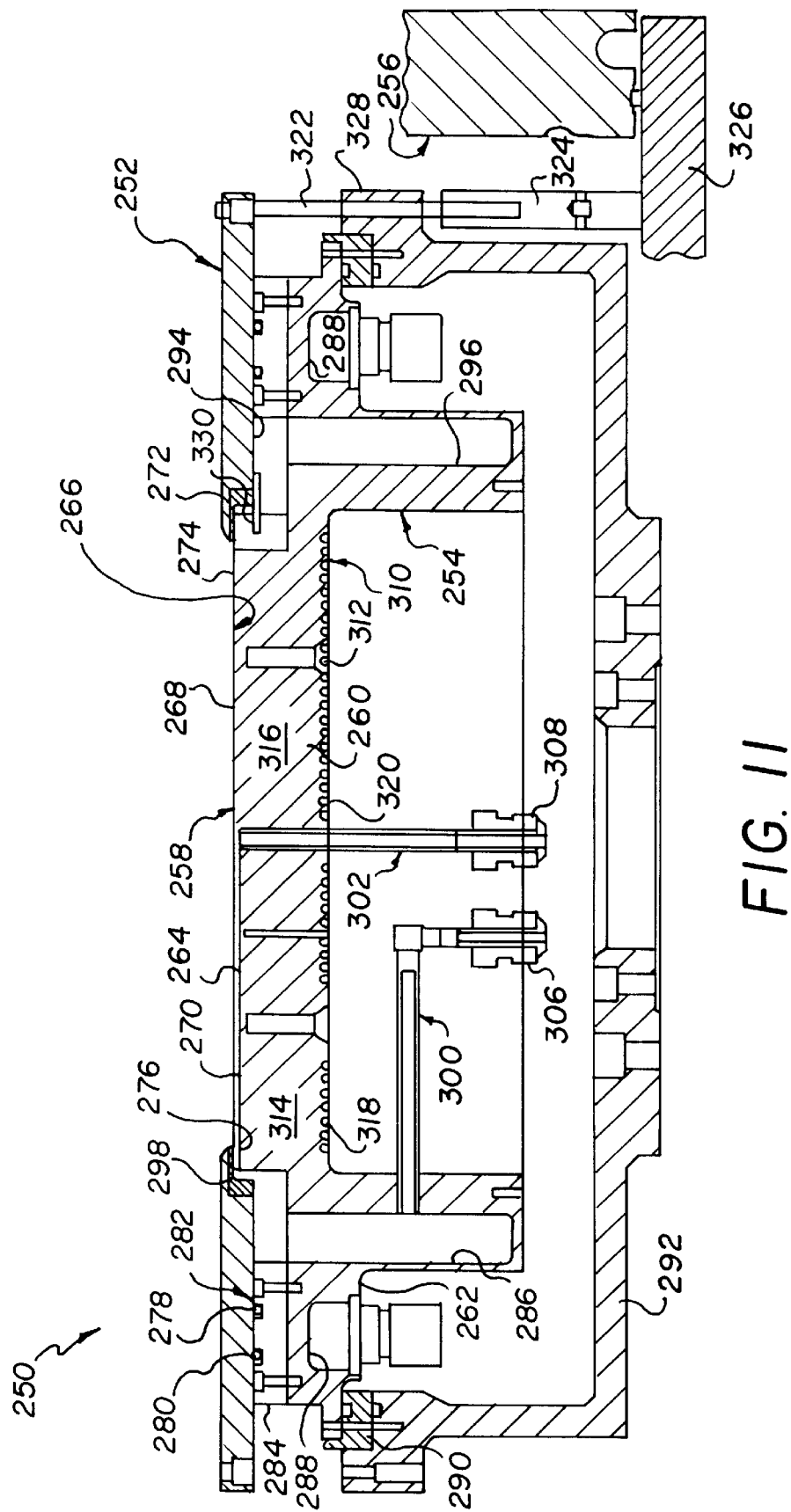
FIG. 11 is a cross-sectional view of an alternative chuck particularly suited for fabricating semiconductor wafer substrates with a multi-zone heating unit and a mechanical clamp that forms a first seal with the substrate and a second seal with an extended portion of the chuck body.

FIG. 11 depicts a chuck 250 having a different sealing arrangement between a mechanical clamp 252 and a chuck body 254 within a vacuum processing chamber 256. The chuck 250 is particularly arranged for manufacturing semiconductor wafers. A substrate 258, such as a semiconductor wafer, is mounted on an heat-conducting portion 260 of the chuck body 254, and the mechanical clamp 252 seals the substrate 258 to a thermally isolated portion 262 of the chuck body 254.

A mounting surface 264 of the chuck body 254 engages a back surface 266 of the substrate 258, forming between them a heat-transfer interface 268. Similar to earlier embodiments, a star-burst pattern of channels 270 is formed in the mounting surface 264 for circulating fluid throughout and beyond the interface 268.

An insulated portion 272 (e.g., ceramic) of the mechanical clamp 252 engages a front surface 274 of the substrate 258 forming a first seal 276 with the substrate 258 and also engages a pair of compliant O-rings 278 and 280 forming a second seal 282 with the chuck body 254. The compliant O-rings 278 and 280, which are preferably made from an elastomeric material, provide the required flexibility for sealing substrates having a range of different thicknesses to the chuck body 254. Sometimes, just one of the O-rings 278 and 280 may be needed to provide adequate sealing.

Thermal protection for the O-rings 278 and 280 takes several forms. An insulating ring 284, which is also preferably made of a ceramic material, supports the O-rings 278 and 280 on the thermally isolated portion 262 of the chuck body 254. The thermally isolated portion 262 is isolated from the heat-conducting portion 260 of the chuck body 254 by a thin-walled trough 286. In addition, an annular coolant channel 288 of a conventional coolant system (not shown) extends through the thermally isolated portion 262 for extracting unwanted heat. Another annular seal 290, which connects the chuck body 254 to an axially translatable shroud 292, is similarly protected by the coolant channel 288 in the thermally isolated portion 262 of the chuck body.

The substrate 258, the mechanical clamp 252, the O-rings 278 and 280, the insulating ring 284, and the chuck body 252 bound an annular chamber 294 that surrounds the heat-transfer interface 268 between the substrate 258 and the chuck body 254. The annular chamber 294 and the heat-transfer interface 268 form a separately pressurizable region within the vacuum chamber 256.

A portion of the annular chamber 294, which is shaped largely by the thin-walled trough 286, functions as an inlet manifold 296 for distributing fluid around a periphery 298 of the heat-transfer interface 268. A single inlet conduit 300 supplies fluid to the inlet manifold 296, and a single outlet conduit 302 extends through a center of the mounting surface 264 for exhausting fluid from the heat-transfer interface 268. The channels 270 formed in the mounting surface 264 extend through the periphery 298 of the heat-transfer interface 268 to permit a free flow of fluid between the heat-transfer interface 268 and the annular chamber 294. Fluid couplings 306 and 308 connect the inlet and outlet conduits 300 and 302 to flow controls (not shown) similar to the other embodiments.

A direction of flow, which preferably extends from the annular chamber 294 to the heat-transfer interface 268, can be reversed by reversing the functions of the inlet and outlet conduits 300 and 302. The location, size, and number of the inlet and outlet conduits 300 and 302 as well as the channels 270 in the mounting surface 264 can be chosen to control flow patterns throughout the heat-transfer interface 268.

A multi-zone heater 310 provides further control over temperature variations within the heat-transfer interface 268. The heat-conducting portion 260 of the chuck body 254, which is preferably made of a high-thermal-conductivity material such as copper or stainless steel, is interrupted by an isolation ring 312 that is made from a low-thermal-conductivity material, such as ceramic, or is just left empty for separating the heat-conducting portion 260 into different heating zones 314 and 316. Separately controlled coils 318 and 320 regulate temperatures between the different zones 314 and 316.

The mechanical clamp 252 is secured to pins 322 that are translatable along vertical guides 324 projecting from a bottom wall 326 of the vacuum chamber 256. The shroud 292 also contains vertical guides 328 engaging the same pins 322 for translating the chuck body 254 into engagements with the substrate 258 and the mechanical clamp 252. The vertical guides 324 of the pins 322 permit the chuck body 254, the substrate 258, and the mechanical clamp 252 to translate together into a desired processing position within the chamber 256. Ledges 330 extending from a bottom of the mechanical clamp 252 support the substrate 258 above the chuck body 254 for loading and unloading the substrate 258 from the processing chamber 256.

FIGS. 12–15 depict a chuck 350 that embodies yet another of the types of mounting and sealing arrangements made possible by my invention. The chuck 350 is particularly suitable for making data storage heads. A substrate 352 is mounted on a slotted rim 354 (shown best in FIG. 15) that projects from a mounting surface 356 of a chuck body 358. The slotted rim 354 provides a peripheral support for the substrate 352, and the remaining mounting surface 356 forms together with a back surface 360 of the substrate 352 a heat-transfer interface 362 between the substrate 352 and the chuck body 358.

In place of channels formed in the mounting surface 356, the slotted rim 354 supporting the substrate 352 provides a space between the mounting surface 356 and the back surface 360 of the substrate 352 within which fluid can circulate throughout the heat-transfer interface 362. Spacings between the back surface 360 of the substrate 352 and the mounting surface 356 of a chuck body 358 in a range of 0.05 mm to 0.025 mm are preferred. The slotted rim 354 can be formed integral with the chuck body 358 or as a separate structure, such as a ceramic ring. Posts or other discontinuous supports can be used for mounting the substrate 352.

The chuck body 358 includes an assembly of plates 364–370. Heat-conducting plates 364 and 366, which are preferably made of copper, are machined to provide space for conduits 372 that circulate coolant throughout the chuck body 358 as well as for inlet and outlet conduits 374 and 376 that convey a fluid (gas) to and from the heat-transfer interface 362. The heat-conducting plate 366 also supports a heating unit 378. Insulating plate 368, which is preferably made of ceramic, thermally isolates support plate 370 from the heating unit 378. The support plate 370 is sealed to a surrounding shroud 380 that is translatable within a vacuum processing chamber 382. An electromagnet 384 is encased within the shroud 380 to prevent out-gassing into the processing chamber 382.

A mechanical clamp 386, which is also machined to accommodate some of the coolant conduits 372, forms a first seal 388 with a front surface 390 of the substrate 352, and a second seal 392 with the chuck body 358. The second seal 392 includes a pair of compliant O-rings 394 and 396 mounted on an insulating ring 398 that is attached to the support plate 370. A coolant channel 400 formed between the insulating ring 398 and the support plate 370 further protects the O-rings 394 and 396 from heat transfers. The coolant conduits 372 that are partly encased by the mechanical clamp 386 can be independently controlled to also prevent heat from reaching the O-rings 394 and 396 through the mechanical clamp 386.

The mechanical clamp 386 and its two seals 388 and 392 with the substrate 352 and the chuck body 358 confine a space 402 surrounding the heat-transfer interface. Within the space 402 is an inlet manifold 404 (shown best in FIG. 15) that is formed in the heat-conducting plate 364 of the chuck body 358. The inlet conduit 374 conveys fluid directly into the inlet manifold 404, which circulates the fluid around an entire periphery 406 of the heat-transfer interface 362. The outlet conduit 376 exhausts fluid directly from the heat-transfer interface 362. The slotted rim 354 permits a free flow (exchange) of fluid between the inlet manifold 404 and the heat-transfer interface 362 to complete a path of circulation from the inlet conduit 374 to the outlet conduit 376.

Figure 13:
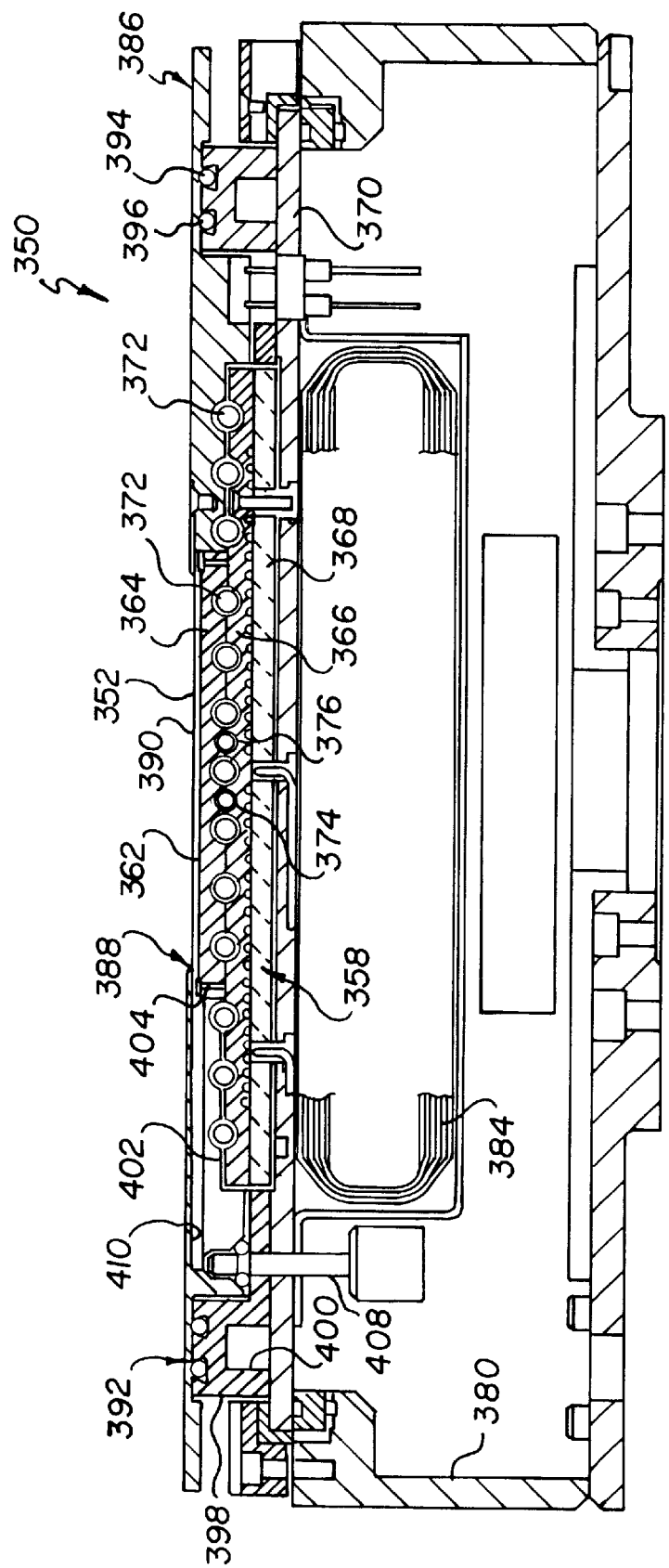
FIG. 13 is a second cross-sectional view of the chuck of FIG. 12 showing conduits of the cooling unit as well as inlet and outlet conduits for conveying gas to and from the substrate-chuck interface.
Figure 15:
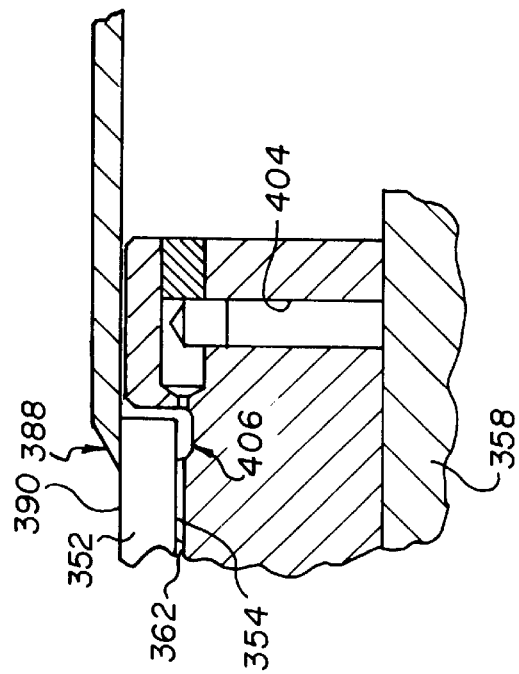
FIG. 15 is an enlarged cross-sectional view of the inlet manifold in the chuck body.
Figure 14:
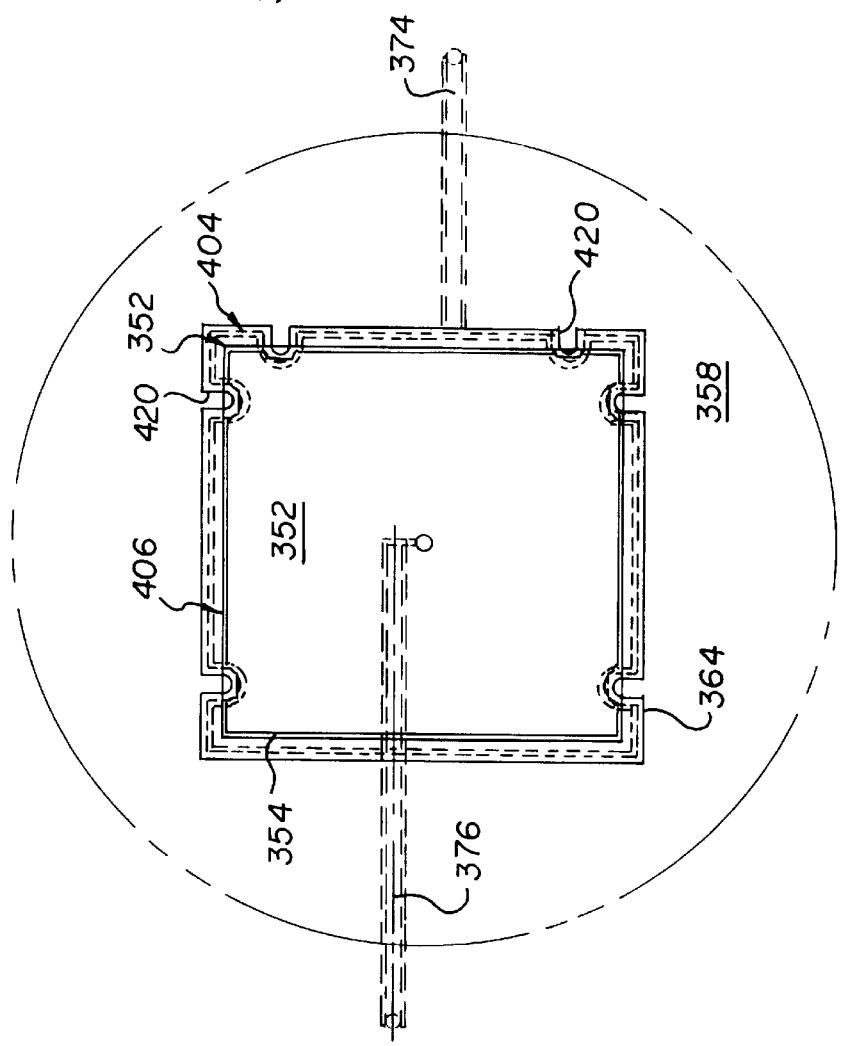
FIG. 14 is a top view of the same chuck showing the substrate and a portion of the chuck body with the mechanical clamp removed. The view best illustrates an inlet manifold in the chuck body that surrounds a periphery of the substrate.

Of course, the direction of flow can easily be reversed by exchanging the functions of the inlet and outlet conduits 374 and 376. FIG. 13 also shows an alternative inlet conduit 408 that includes a passageway 410 through the mechanical clamp 386 to the inlet manifold 404. Also, a fluid conduit 412 between the two O-rings 394 and 396 can be used as a differential pump-out to remove any fluid that may have leaked past the innermost O-ring 394.

Figure 12:
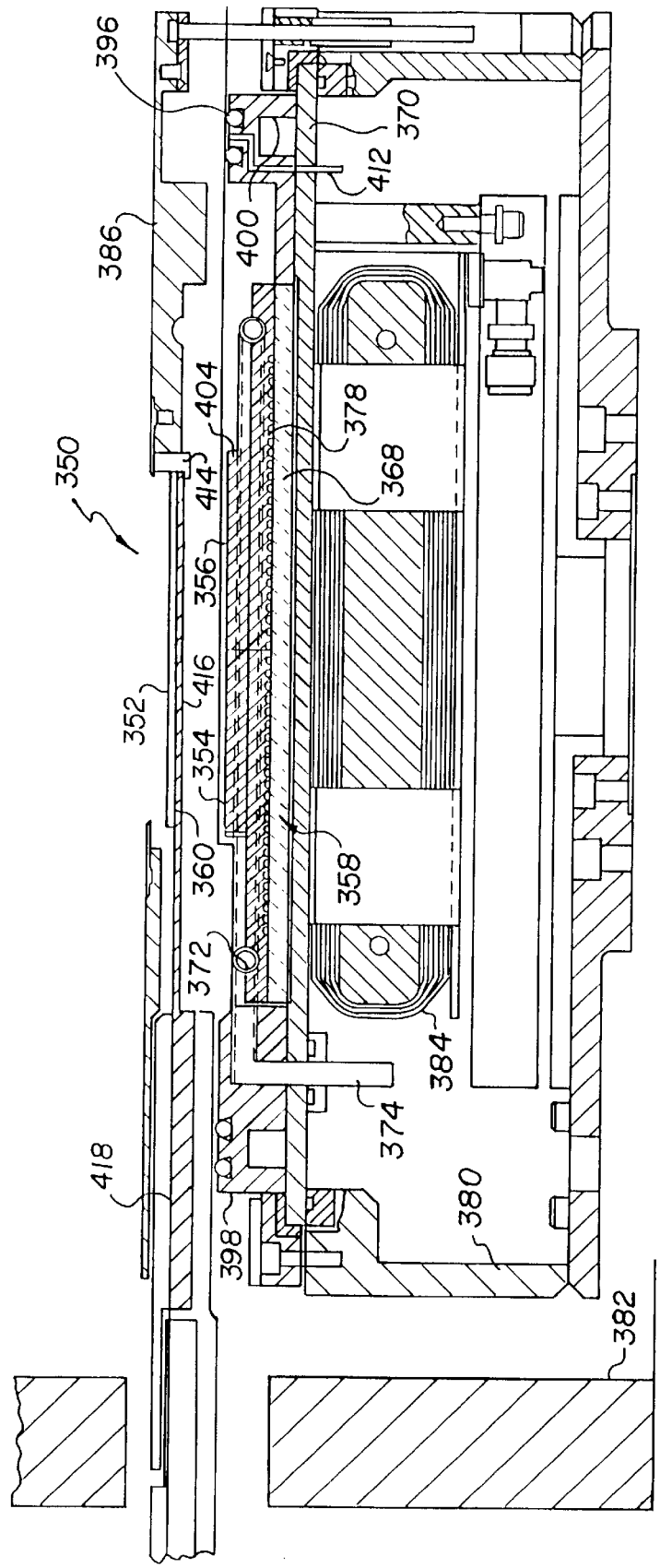
FIG. 12 is a first cross-sectional view of an alternative chuck particularly suited for fabricating data storage head substrates with combined heating and cooling units, an electromagnet, and a mechanical clamp that encloses some of the cooling unit.

FIGS. 12 and 13 also contrast raised and lowered positions of the chuck body 358. When lowered, the substrate 352 is supported on ledges 414 of the mechanical clamp 386 with sufficient clearance to permit an end effector 416 of a robot arm 418 to remove the substrate 352 from the processing chamber 382. U-shaped recesses 420 (see FIG. 14) in the chuck body 358 provide clearance for the ledges 414 while the mechanical claim 386 is engaged with the chuck body 358.

Figure 16A:
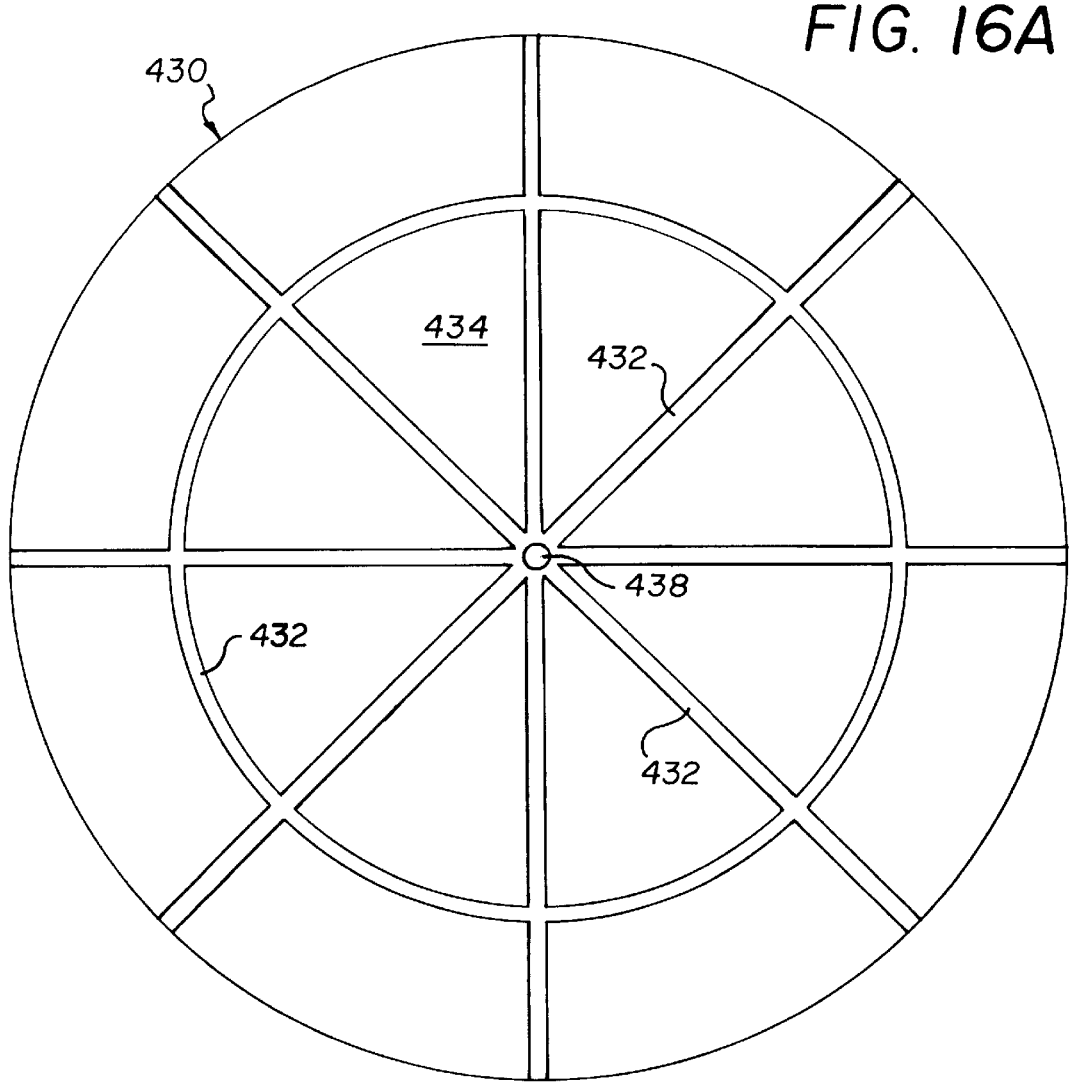
FIGS. 16A and 16B are top and side schematic views of a substrate-chuck interface in which a star-burst pattern of channels is formed in a mounting surface of the chuck to enable a free flow of gas through a periphery of the substrate-chuck interface.
Figure 16B:
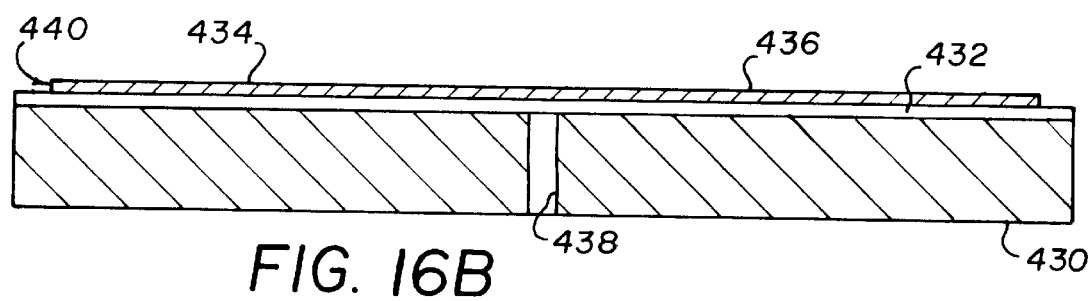

The remaining FIGS. 16A-18B show alternative surface structures for supporting substrates without blocking free flows of fluid beyond a periphery of the supports. For example, FIGS. 16A and 16B show a chuck body 430 having a star burst pattern of channels 432 formed in a mounting surface 434 for a substrate 436. The channels 432 converge at the center of the mounting surface 434 to an inlet/outlet conduit 438 and extend beyond a periphery 440 of the substrate 436 for promoting a free flow of fluid through this region. Other continuous or discontinuous patterns of channels 432 can also be used to affect distributions of fluid between the substrate 436 and the mounting surface 434.

Figure 17A:
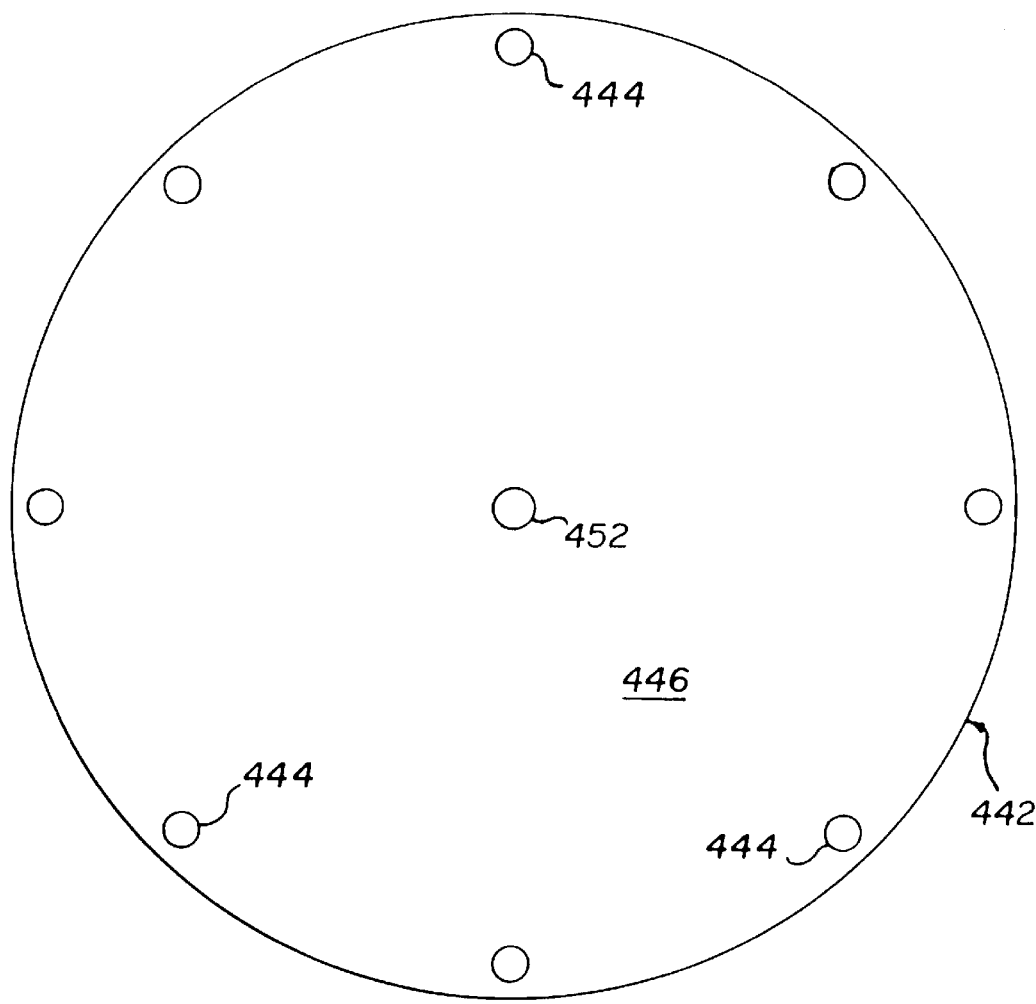
FIGS. 17A and 17B are top and side schematic views of another substrate-chuck interface in which an array of posts project from a mounting surface of the chuck into contact with a back side of the substrate to provide clearance for a similar free flow of gas.
Figure 17B:
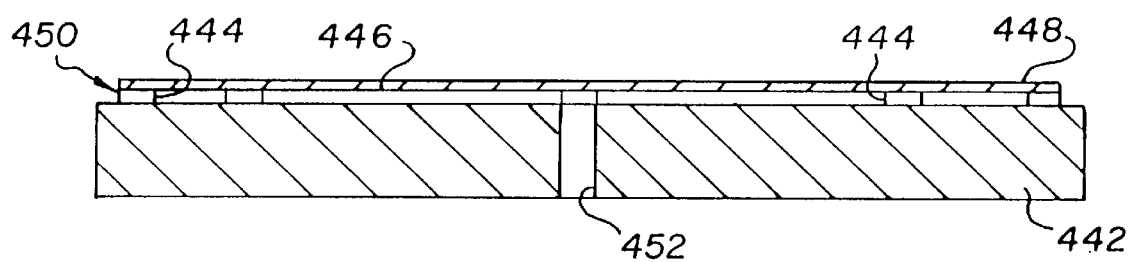

FIGS. 17A and 17B depict a chuck body 442 having support posts 444 that project above a mounting surface 446 for supporting a substrate 448. The posts 444 provide clearance between the substrate 448 and the mounting surface 446 to permit free flows of fluid from beyond a periphery 450 of the substrate to the inlet/outlet conduit 452. Although the posts 444 are preferably positioned near the periphery 450 of the substrate 448 to oppose any bending moment imparted by a mechanical clamp, the size, number, and positions of the posts 444 can be changed to provide different support for the substrate 448.

Figure 18A:
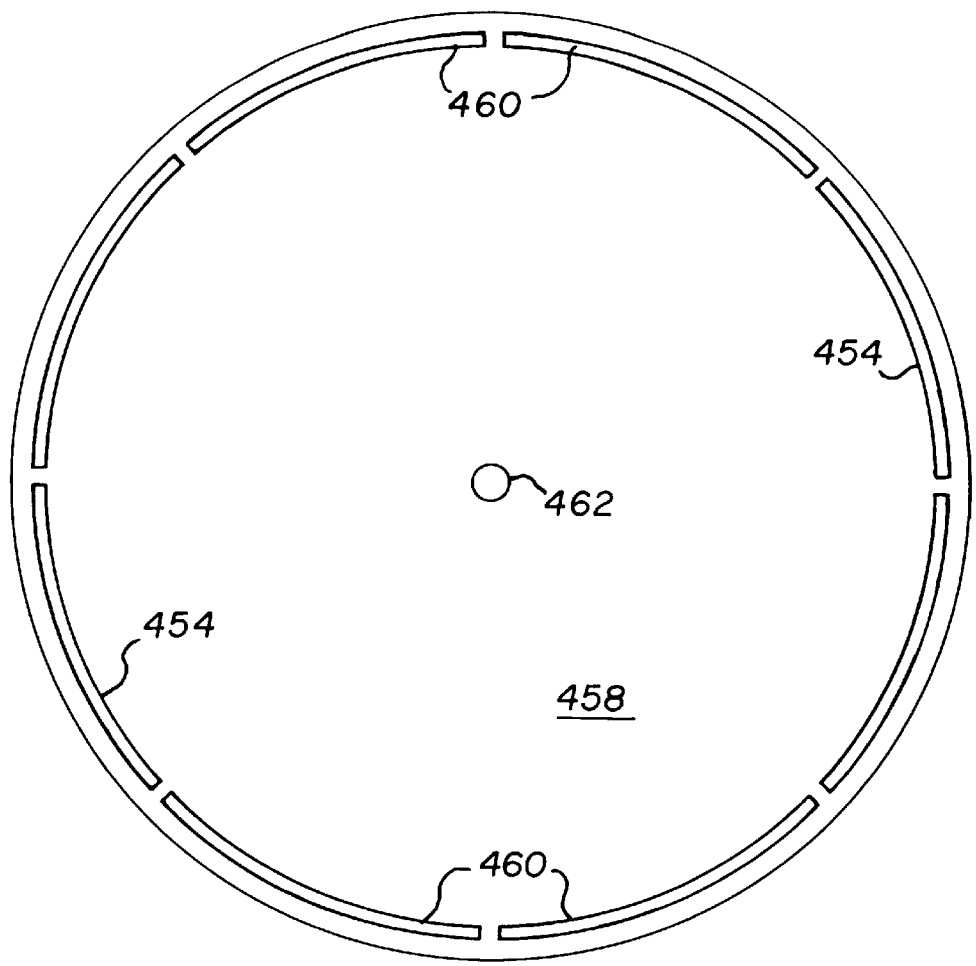
FIGS. 18A and 18B are top and side schematic views of yet another substrate-chuck interface in which a slotted rim replaces the posts for providing a clearance space for the flow of gas between the substrate and the chuck. Slots in the rim permit a free flow of gas through a periphery of the substrate-chuck interface.
Figure 18B:
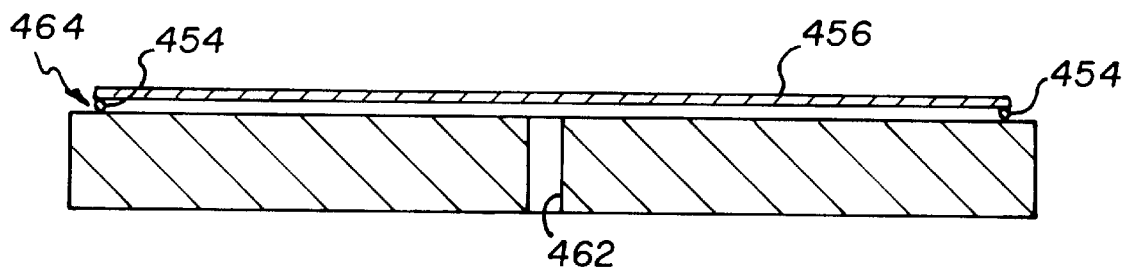

The drawing figures, FIGS. 18A and 18B, further illustrate use of a slotted rim 454 for supporting a substrate 456 above a chuck mounting surface 458. The resulting clearance together with the slots 460 permits a free flow of fluid to an inlet/outlet conduit 462 from beyond a periphery 464 of the substrate 456. The size, number and distribution of the slots 460 can affect patterns of flow within the clearance space between the substrate 456 and the mounting surface 458. Additional slotted rings can also be used to adjust pressure or flow within the same clearance space.

I claim:

1. A chuck for low-pressure processing equipment arranged to provide a substantially uninhibited flow of fluid through a space between the chuck and a substrate intended for processing comprising:
   a chuck body having a mounting surface for supporting the substrate;
   a pair of concentric inner and outer conduits extending through said chuck body and having first and second ends;
   said inner conduit extending within said outer conduit:
   said first ends of the concentric inner and outer conduits forming concentric openings in said mounting surface; and
   said second ends of the concentric inner and outer conduits being connected to a fluid control system for supporting a substantially uninhibited flow of fluid to and from a space between the mounting surface and the substrate.

2. The chuck of claim 1 in which said first end of the inner conduit is recessed in said mounting surface with respect to said first end of the outer conduit for supporting a substantially uninhibited flow of the fluid between said inner and outer conduits.

3. The chuck of claim 1 in which said pair of concentric inner and outer conduits is one of a plurality of pairs of concentric inner and outer conduits, said inner conduits being connected to a first manifold and said outer conduits being connected to a second manifold.

4. The chuck of claim 3 in which at least one channel is formed in said mounting surface for promoting flows of fluid between the first ends of the pairs of concentric conduits.

5. The chuck of claim 4 in which said at least one channel is one of a plurality of channels arranged in a pattern.

6. The chuck of claim 3 in which said plurality of pairs of concentric conduits is arranged in a ring.

7. A thermally conductive chuck for supporting a substrate in a processing chamber comprising:
   a temperature-regulated chuck body having a mounting surface for supporting the substrate within an evacuated space of the processing chamber;
   said mounting surface forming a portion of a heat-transfer interface with the substrate for conveying heat between said temperature-regulated chuck body and the substrate;
   an intermediate sealing structure for sealing said temperature-regulated chuck body to the substrate for confining a heat-transfer fluid within an isolated portion of the evacuated space;
   a pair of concentric conduits for conveying fluid to and from the isolated portion of the evacuated space; and
   wherein one of said pair of concentric conduits extends within the other of said pair of concentric conduits.

8. The chuck of claim 7 in which one of said concentric conduits is arranged as an inlet conduit, and the other of said concentric conduits is arranged as an outlet conduit.

9. The chuck of claim 7 further comprising a control system connected to said inlet and outlet conduits for regulating flows of the heat-transfer fluid through the isolated evacuated space portion.

10. The chuck of claim 7 in which said concentric conduits include concentric openings in said mounting surface for promoting flows of the heat-transfer fluid to and from said heat-transfer interface.

11. The chuck of claim 10 in which said inner conduit is recessed in said mounting surface with respect to said outer conduit for promoting flows of the heat-transfer fluid between said inner and outer conduits at the heat-transfer interface.

12. The chuck of claim 7 in which said intermediate sealing structure provides for sealing said temperature-regulated chuck body to the substrate beyond the heat-transfer interface to permit substantially uninhibited flow of the heat-transfer fluid through a periphery of the heat-transfer interface.

13. The chuck of claim 12 in which a plurality of channels is formed in said mounting surface for facilitating the substantially uninhibited flow of heat-transfer fluid through the periphery of the heat-transfer interface.

14. The chuck of claim 12 in which said mounting surface includes a plurality of spaced substrate supports that project from a remaining portion of said mounting surface for facilitating the substantially uninhibited flow of heat-transfer fluid through the periphery of the heat-transfer interface.

15. The chuck of claim 12 in which the heat-transfer interface forms a first part of the isolated evacuated space portion; and a surrounding chamber bounded by said intermediate sealing structure, said chuck body, and the substrate forms a second part of the isolated evacuated space portion.

16. The chuck of claim 15 in which said surrounding chamber is further bounded by first and second seals that seal said intermediate sealing structure to the substrate and the chuck body.

17. The chuck of claim 15 in which the substantially uninhibited flow of heat-transfer fluid flows between the first and second parts of the isolated evacuated space portion.

18. The chuck of claim 17 in which said concentric conduits are connected to said first part of the isolated evacuated space portion, and a single-tube conduit is connected to the second part of the isolated evacuated space portion.

19. A thermally conductive chuck for supporting a substrate in a low-pressure processing environment comprising:
- a chuck body having a mounting surface for supporting the substrate within the low-pressure processing environment;
- said mounting surface being positioned for forming together with the substrate a heat-transfer interface having a periphery surrounding a central portion of the substrate;
- an intermediate sealing structure forming together with said chuck body and the substrate a separately pressurizable region within the low-pressure processing environment for sustaining an elevated heat-transfer fluid pressure at the heat-transfer interface;
- one of a pair of concentric conduits being arranged as an inlet conduit for conveying heat-transfer fluid to the separately pressurizable region and the other of said pair of concentric conduits being arranged as an outlet for conveying the heat-transfer fluid from the separately pressurizable space;
- one of said pair of concentric conduits extending within the other of said pair of conduits: and
- a control system for directing flows of the heat-transfer fluid through the concentric conduits for controlling fluid pressures at the heat-transfer interface.

20. The chuck of claim 19 in which said concentric conduits extend through said chuck body and form concentric openings in said mounting surface.

21. The chuck of claim 20 in which one of said concentric conduits is recessed in said mounting surface with respect to the other of said concentric conduits for promoting free flow of the heat-transfer gas between the concentric conduits.

22. The chuck of claim 19 in which a first portion of said separately pressurizable region is formed by said heat-transfer interface between said mounting surface and the substrate; and a second portion of said separately pressurizable region is bounded by said intermediate sealing structure, said chuck body, and the substrate.

23. The chuck of claim 22 in which said pair of concentric conduits is connected to the first portion of the separately pressurizable region, and another conduit is connected to the second portion of the separately pressurizable region.

24. The chuck of claim 23 in which said another conduit supports a flow of the heat-transfer fluid to the second portion of the separately pressurizable region, and said concentric conduits support a net flow of fluid from the first portion of the separately pressurizable region.

25. The chuck of claim 23 in which said another conduit supports a flow of the heat-transfer fluid from the second portion of the separately pressurizable region, and said concentric conduits support a net flow of fluid to the first portion of the separately pressurizable region.

26. The chuck of claim 19 in which said pair of concentric conduits is one of a plurality of pairs of concentric inlet and outlet conduits, said inlet conduits being connected to an inlet manifold and said outlet conduits being connected to an outlet manifold.

27. The chuck of claim 26 in which channels are formed in said mounting surface for promoting flows of fluid between the pairs of concentric conduits.

* * * * *